US012051369B2

(12) United States Patent
Kim et al.

(10) Patent No.: US 12,051,369 B2
(45) Date of Patent: Jul. 30, 2024

(54) DISPLAY APPARATUS

(71) Applicant: Samsung Display Co., Ltd., Yongin-si (KR)

(72) Inventors: Yanghee Kim, Yongin-si (KR); Hyunchol Bang, Yongin-si (KR); Youngsoo Yoon, Yongin-si (KR); Bongwon Lee, Yongin-si (KR); Wonse Lee, Yongin-si (KR); Donghyeon Jang, Yongin-si (KR); Yujin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/116,892

(22) Filed: Mar. 3, 2023

(65) Prior Publication Data
US 2023/0386405 A1 Nov. 30, 2023

(30) Foreign Application Priority Data
May 26, 2022 (KR) ........................ 10-2022-0064779

(51) Int. Cl.
| G09G 3/36 | (2006.01) |
| G02F 1/133 | (2006.01) |
| G02F 1/1345 | (2006.01) |
| G09G 3/3233 | (2016.01) |
| H10K 59/131 | (2023.01) |

(52) U.S. Cl.
CPC ......... *G09G 3/3233* (2013.01); *H10K 59/131* (2023.02); *G09G 2300/0408* (2013.01); *G09G 2300/0819* (2013.01); *G09G 2300/0842* (2013.01); *G09G 2310/0278* (2013.01)

(58) Field of Classification Search
CPC .............................................. G09G 2300/0426
See application file for complete search history.

(56) References Cited

U.S. PATENT DOCUMENTS

| 7,414,599 B2 | 8/2008 | Chung et al. |
| 10,186,180 B2 | 1/2019 | Park et al. |
| 11,237,442 B2 | 2/2022 | Yang et al. |

(Continued)

FOREIGN PATENT DOCUMENTS

| KR | 10-0560780 | 3/2006 |
| KR | 10-2007-0082974 | 8/2007 |

(Continued)

*Primary Examiner* — Nan-Ying Yang
(74) *Attorney, Agent, or Firm* — KILE PARK REED & HOUTTEMAN PLLC

(57) ABSTRACT

A display apparatus includes drivers included in first, second, and third driver groups in a peripheral area and disposed along a round corner of a display area. The first driver group includes a first driver electrically connected to a signal line on an i-th row, and a second driver adjacent to the first driver in a first arrangement direction and electrically connected to a signal line disposed on a (i+j)-th row (i<j). The second driver group includes a third driver electrically connected to a signal line disposed on an (i+n)-th row (j<n), and a fourth driver electrically connected to a signal line disposed on a (i+m)-th row (n<m) and adjacent to the third driver in a direction opposite to a first arrangement direction. A separation region is between the third driver group and the second driver group.

20 Claims, 12 Drawing Sheets

(56) References Cited

U.S. PATENT DOCUMENTS

| | | | |
|---|---|---|---|
| 2018/0166037 A1* | 6/2018 | Lee | G09G 3/3677 |
| 2018/0322837 A1* | 11/2018 | Sakurai | G02F 1/13452 |
| 2020/0135764 A1* | 4/2020 | Ha | G02F 1/1345 |
| 2021/0288135 A1 | 9/2021 | Lee et al. | |
| 2022/0209148 A1 | 6/2022 | Park et al. | |

FOREIGN PATENT DOCUMENTS

| | | |
|---|---|---|
| KR | 10-2017-0026692 | 3/2017 |
| KR | 10-2020-0124352 | 11/2020 |
| KR | 10-2021-0116731 | 9/2021 |

* cited by examiner

DISPLAY APPARATUS

CROSS-REFERENCE TO RELATED APPLICATION(S)

This application claims priority to and benefits of Korean Patent Application No. 10-2022-0064779 under 35 U.S.C. § 119, filed on May 26, 2022 in the Korean Intellectual Property Office, the entire contents of which are incorporated herein by reference.

BACKGROUND

1. Technical Field

One or more embodiments relate to a display apparatus.

2. Description of the Related Art

In a display panel such as an organic light-emitting display panel, thin-film transistors are arranged in a display area to control brightness and the like of a light-emitting diode. The thin-film transistors are configured to control a corresponding light-emitting diode to emit light of a preset color by using a data signal, a driving voltage, and a common voltage transferred thereto.

A data driving circuit, a driving voltage supply line, a common voltage supply line, and the like may be arranged in a non-display area outside the display area to provide data signals, a driving voltage, a common voltage, and the like.

SUMMARY

One or more embodiments include a display apparatus with a reduced dead area, but the purpose of the disclosure is not limited thereto.

Additional aspects will be set forth in part in the description which follows and, in part, will be apparent from the description, or may be learned by practice of the embodiments of the disclosure.

According to one or more embodiments, a display apparatus may include a substrate including a display area and a peripheral area, the display area including a round corner, and the peripheral area being outside the display area, sub-pixel circuits disposed in the display area, light-emitting diodes disposed in the display area and electrically connected to the sub-pixel circuits, signal lines electrically connected to the sub-pixel circuits and each extending in a first direction in the display area, and drivers disposed in the peripheral area and electrically connected to the signal lines. The drivers may include a first driver group including a first driver and a second driver, the first driver being electrically connected to a signal line disposed on an i-th row (i may be a natural number) among the signal lines, and the second driver being electrically connected to a signal line disposed on a (i+j)-th row (j may be a natural number) among the signal lines and being adjacent to the first driver in a first arrangement direction, a second driver group including a third driver and a fourth driver, the third driver being electrically connected to a signal line disposed on an (i+n)-th row (n may be a natural number greater than j) among the signal lines, the fourth driver being electrically connected to a signal line disposed on a (i+m)-th row (m may be a natural number greater than n) among the signal lines and being adjacent to the third driver in a direction opposite to the first arrangement direction, and a third driver group adjacent to the second driver group in the first arrangement direction with a separation region between the second driver group and the third driver group. The first driver group, the second driver group, and the third driver group may be disposed along the round corner of the display area.

The second driver of the first driver group may be a driver disposed closest to the second driver group. The third driver of the second driver group may be a driver disposed farthest away from the first driver group. A carry signal output from the second driver may be transferred to the third driver through a carry signal line passing between the second driver group and an edge of the substrate.

The sub-pixel circuits may each include a driving thin-film transistor, a compensation thin-film transistor that electrically connects a gate of the driving thin-film transistor to a drain of the driving thin-film transistor, and a control thin-film transistor electrically connected to the driving thin-film transistor.

The signal lines may be electrically connected to a gate of the compensation thin-film transistor or a gate of the control thin-film transistor of each of the sub-pixel circuits.

A driving signal output from the third driver may be transferred to the signal line disposed on the (i+n)-th row through a first signal connection line passing across the separation region, and a driving signal output from the fourth driver may be transferred to the signal line disposed on the (i+m)-th row through a second signal connection line passing across the separation region.

A driving signal output from a driver disposed closest to the first driver group among drivers of the second driver group, may be transferred to a signal line disposed on an (i+p)-th row (p may be a natural number greater than m) through a third signal connection line.

The display apparatus may further include a common voltage supply line disposed in the peripheral area. A portion of the first signal connection line, a portion of the second signal connection line, and a portion of the third signal connection line may each overlap a first portion of the common voltage supply line in the peripheral area.

The first portion of the common voltage supply line may be disposed between the second driver group and an edge of the substrate, a second portion of the common voltage supply line integrally connected to the first portion of the common voltage supply line, may be disposed between the first driver group and the edge of the substrate, and a width of the second portion of the common voltage supply line may be greater than a width of the first portion.

A carry signal output from the driver disposed closest to the first group among drivers of the second driver group may be transferred to a driver disposed closest to the second driver group among drivers of the third driver group through a carry signal line passing across the separation region.

The driver disposed closest to the second driver group among drivers of the third driver group, may be electrically connected to a signal line disposed on an (i+q)-th row (q may be a natural number greater than p) among the signal lines.

The display apparatus may further include a fourth driver group disposed between the first driver group and the display area, and including drivers that provide signals different from signals of the drivers of the first driver group, and a fifth driver group disposed between the second driver group and the display area, and including drivers that provide signals different from signals of the drivers of the second driver group. Signal connection lines connected to an output terminal of each of the drivers of the fifth driver group may pass across the separation region.

A portion of one of the signal connection lines may be disposed between the first signal connection line and the second signal connection line.

A portion of one of the signal connection lines may be disposed on a layer different from a layer on which the first signal connection line and the second signal connection line may be disposed.

According to one or more embodiments, a display apparatus may include a substrate including a display area, a peripheral area outside the display area, and a notch, sub-pixel circuits disposed in the display area, light-emitting diodes disposed in the display area and electrically connected to the sub-pixel circuits, signal lines electrically connected to the sub-pixel circuits and each extending in a first direction in the display area, and drivers disposed in the peripheral area and electrically connected to the signal lines. The drivers may include a first driver group including a first driver and a second driver, the first and second drivers being disposed in a first arrangement direction, wherein a carry signal output from the first driver may be provided to the second driver through a carry signal line, a second driver group including a third driver and a fourth driver, the third and fourth drivers being disposed in a direction opposite to the first arrangement direction, and a third driver group including drivers disposed in the first arrangement direction. The first driver group, the second driver group, and the third driver group may be disposed in the first arrangement direction. The second driver group may be apart from the third driver group with a separation region corresponding to the notch therebetween. The third driver may be apart farthest away from the first driver group among the drivers of the second driver group. The third driver that receives a carry signal output from the second driver through a carry signal line connecting the second driver to the third driver.

The first driver of the first driver group may be electrically connected to a signal line disposed on an i-th row (i may be a natural number) among the signal lines, the second driver may be electrically connected to a signal line disposed on an (i+j)-th row (j may be a natural number) among the signal lines, the third driver of the second driver group may be electrically connected to a signal line disposed on an (i+n)-th row (n may be a natural number greater than j) among the signal lines, and the fourth driver of the second driver group may be electrically connected to a signal line disposed on an (i+m)-th row (m may be a natural number greater than n) among the signal lines.

A driving signal output from the third driver may be transferred to the signal line disposed on the (i+n)-th row through a first signal connection line passing across the separation region, and a driving signal output from the fourth driver may be transferred to the signal line disposed on the (i+m)-th row through a second signal connection line passing across the separation region.

The display apparatus may further include a common voltage supply line disposed in the peripheral area. A portion of the first signal connection line, and a portion of the second signal connection line may overlap a first portion of the common voltage supply line in the peripheral area.

The display apparatus may further include a fourth driver group disposed adjacent to the first driver group in a direction facing the peripheral area in the display area, and including drivers that provide signals different from signals of the drivers of the first driver group, a fifth driver group disposed adjacent to the second driver group in a direction facing the peripheral area in the display area, and including drivers that provide signals different from signals of the drivers of the second driver group, and a carry signal line connecting a driver adjacent to the fifth driver group among the drivers of the fourth driver group, to a driver disposed farthest away from the fourth driver group among the drivers of the fifth driver group.

A portion of one of signal connection lines that transfer a driving signal output from each of the drivers of the fifth driver group may be disposed between the first signal connection line and the second signal connection line.

A portion of one of the signal connection lines may be positioned on a layer different from a layer on which the first signal connection line and the second signal connection line may be disposed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
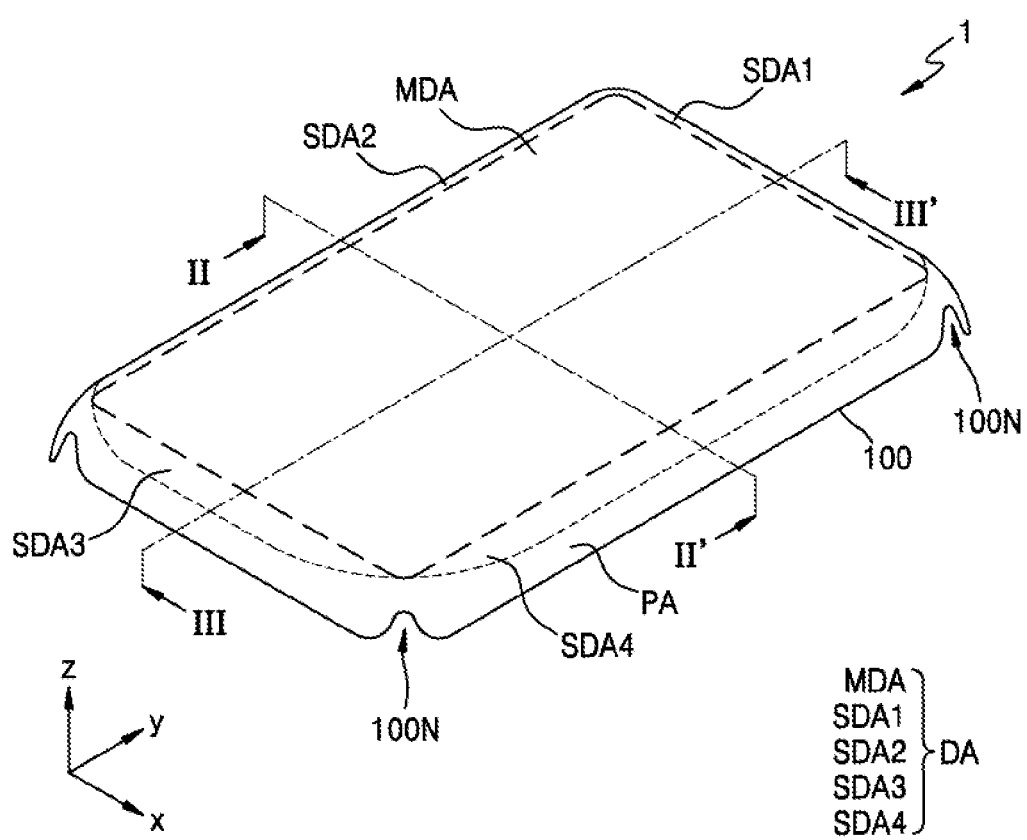
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

As used herein, when various elements such as a layer, a region, a plate, and the like are disposed "on" another element, not only may the elements be disposed "directly on" the other element, but another element may be disposed therebetween. Sizes of elements in the drawings may be exaggerated or reduced for convenience of explanation. As an example, the size and thickness of each element shown in the drawings may be arbitrarily represented for convenience of description, and thus, the disclosure is not necessarily limited thereto.

The x-axis, the y-axis, and the z-axis may not be limited to three axes of the rectangular coordinate system, and may be interpreted in a broader sense. For example, the x-axis, the y-axis, and the z-axis may be perpendicular to one another, or may represent different directions that are not perpendicular to one another.

As used herein, "in a plan view" means that an objective portion is viewed from above, and "in a cross-sectional view" means that a cross-section of an objective portion taken vertically is viewed from a lateral side.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or to "not overlap" another element, this may include that the elements are spaced apart from each other, offset from each other, or set aside from each other or any other suitable term as would be appreciated and understood by those of ordinary skill in the art.

In the specification, a display apparatus may be used as a display screen of various products including televisions, notebook computers, monitors, advertisement boards, Internet of things (IoT) apparatuses, as well as portable electronic apparatuses including mobile phones, smart phones, tablet personal computers (PC), mobile communication terminals, electronic organizers, electronic books, portable multimedia players (PMP), navigations, and ultra mobile personal computers (UMPCs. The display apparatus according to an embodiment may be used in wearable devices including smartwatches, watchphones, glasses-type displays, and head-mounted displays (HMD). In an embodiment, the display apparatus 1 may be used as instrument panels for automobiles, center fascias for automobiles, or center information displays (CID) disposed on a dashboard, room mirror displays that replace side mirrors of automobiles, and displays disposed on the backside of front seats as an entertainment device for back seats of automobiles.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
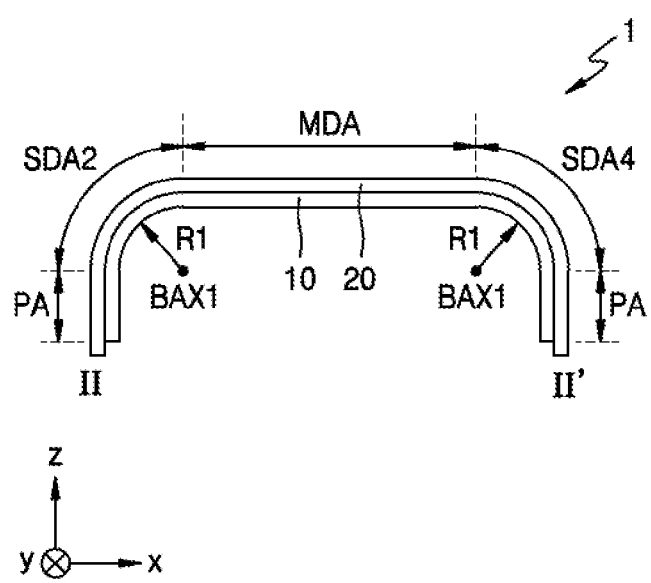
FIG. 2 is a schematic cross-sectional view of the display apparatus of FIG. 1, taken along line II-II' in FIG. 1.
Figure 3:
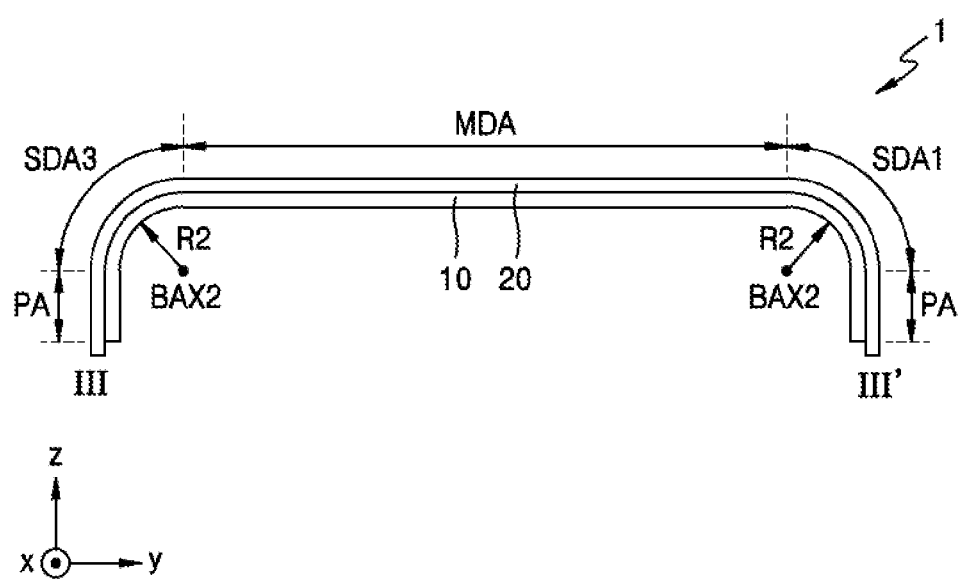
FIG. 3 is a schematic cross-sectional view of the display apparatus of FIG. 1, taken along line III-III' in FIG. 1.

FIG. 1 is a schematic perspective view of a display apparatus 1 according to an embodiment, FIG. 2 is a schematic cross-sectional view of the display apparatus 1, taken along line II-II' of FIG. 1, and FIG. 3 is a schematic cross-sectional view of the display apparatus 1, taken along line III-III' of FIG. 1.

Referring to FIG. 1, the display apparatus 1 may include a display area DA that displays images and a peripheral area PA around the display area DA. The peripheral area PA may be a non-display area that may not display images. A driver circuit that provides electrical signals or power to pixels, may be arranged (disposed) in the peripheral area PA.

At least a portion of the display area DA may be bent with respect to other portions. As an example, the display area DA may include a main display area MDA and at least one side display area, wherein the main display area MDA has a flat image plane, and the at least one side display area has an image plane different from the image plane of the main display area MDA. In an embodiment, it is shown in FIG. 1 that the side display area includes first to fourth side display areas SDA1, SDA2, SDA3, and SDA4. However, the disclosure is not limited thereto.

In an embodiment, the main display area MDA may have a quadrangular shape entirely, and the first to fourth side display areas SDA1, SDA2, SDA3, and SDA4 may be respectively adjacent to the sides of the main display area MDA.

The first side display area SDA1 and the third side display area SDA3 may be arranged along the short sides of the main display area MDA, and the second side display area SDA2 and the fourth side display area SDA4 may be arranged along the long sides of the main display area MDA.

The image planes of the first to fourth side display areas SDA1, SDA2, SDA3, and SDA4 may be continuous with the image plane of the main display area MDA. In other words, the first to fourth side display areas SDA1, SDA2, SDA3, and SDA4 may be continuously connected to the main display area MDA. There may be no dead area (a region that does not display images) between the first to fourth side display areas SDA1, SDA2, SDA3, and SDA4 and the main display area MDA.

The first to fourth side display areas SDA1, SDA2, SDA3, and SDA4 may each be bent with respect to the main display area MDA to have a preset curvature. As shown in FIG. 2, the second and fourth side display areas SDA2 and SDA4 may each be bent around a first bending axis BAX1 parallel to the long sides of the main display area MDA. The second and fourth side display areas SDA2 and SDA4 may each have a round surface to have a first curvature radius R1. As shown in FIG. 3, the first and third side display areas SDA1 and SDA3 may each be bent around a second bending axis BAX2 parallel to the short sides of the main display area MDA. The first and third side display areas SDA1 and SDA3 may each have a round surface to have a second curvature radius R2. The first curvature radius R1 may be the same as or different from the second curvature radius R2.

To prevent the occurrence of cracks and the like that may occur while the display apparatus 1 may be bent, the display apparatus 1 may include a notch 100N as shown in FIG. 1. The notch 100N is formed in the peripheral area PA and may correspond to the corner of the display area DA.

As shown in FIGS. 2 and 3, the display apparatus 1 may include a display panel 10 and a cover window 20 on the display panel 10. The shape of the display apparatus 1 shown in FIGS. 1 to 3 may be substantially the same as the shape of the display panel 10 of the display apparatus 1. As an example, the display panel 10 may include the display area DA and the peripheral area PA. In case that the display apparatus 1 is bent, it may denote that the display panel 10 may be bent.

The cover window 20 may include glass, sapphire, and/or plastic. The cover window 20 may be, for example, ultra-thin glass or colorless polyimide. The cover window 20 may be attached to the display panel 10 by using a transparent adhesive member such as an optically clear adhesive (OCA). The cover window 20 may be bent as shown in FIGS. 2 and 3.

Figure 4:
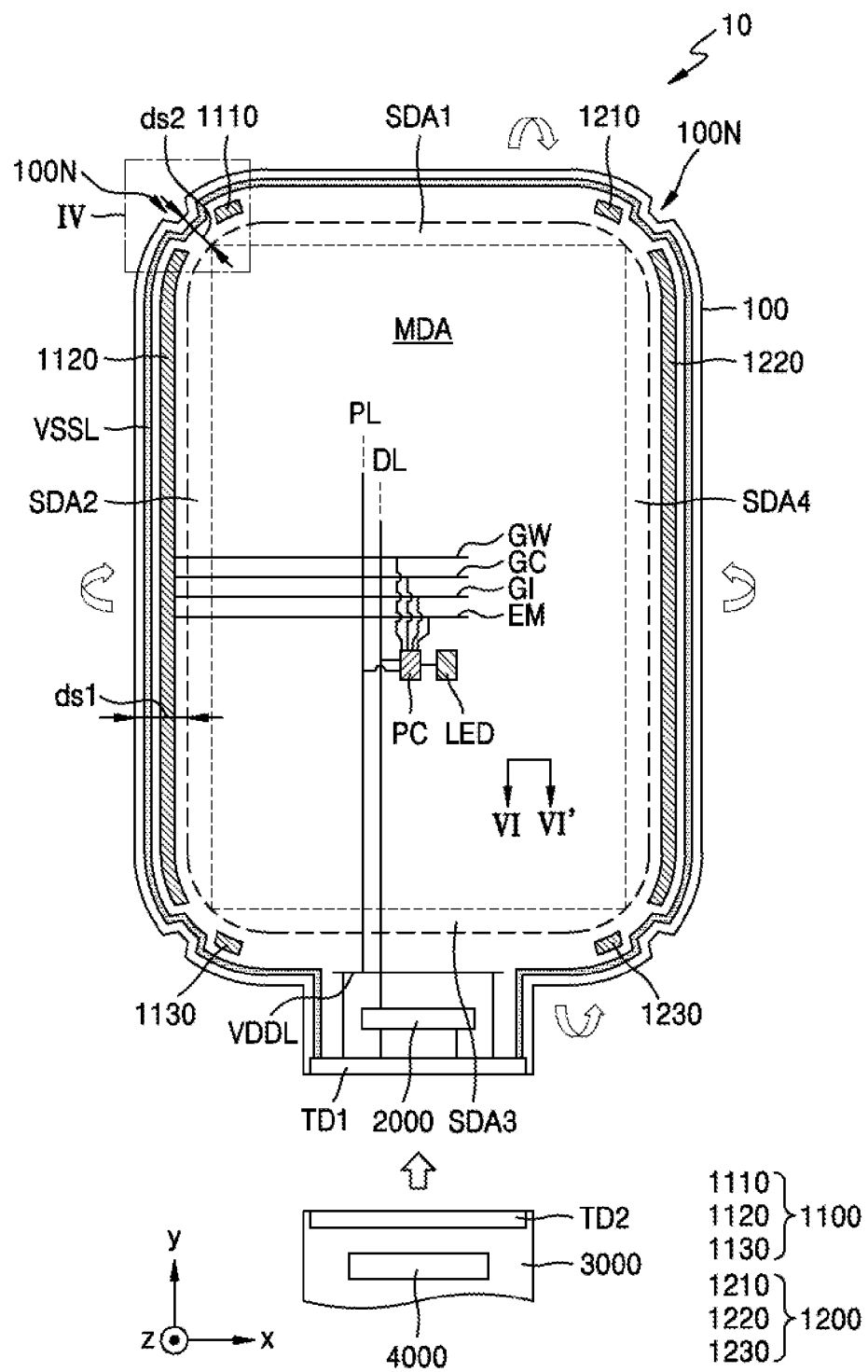
FIG. 4 is a schematic plan view of a display panel of a display apparatus according to an embodiment.

FIG. 4 is a schematic plan view of the display panel 10 of the display apparatus 1 according to an embodiment. For convenience of description, FIG. 4 shows a state in which the display panel 10 is not bent, for example, a state before the display panel 10 may be bent.

Referring to FIG. 4, the display panel 10 may include the display area DA and the peripheral area PA. The shape of the display panel 10 of FIG. 4 may be actually the same as the shape of a substrate 100. In case that the display panel 10 includes the display area DA and the peripheral area PA, it may mean that the substrate 100 includes the display area DA and the peripheral area PA. The display area DA may include a round corner, and the substrate 100 may have a round corner entirely along the round corner of the display area DA.

The display area DA may be bent as described above with reference to FIG. 1.

To prevent portions of the substrate 100 from overlapping each other and to prevent cracks in a layer(s) or a structure formed on the substrate 100 while the display area DA may be bent, the substrate 100 may include the notch 100N. The notch 100N of the substrate 100 may be a structure located in the corner of the substrate 100, and may be formed by removing a portion of the substrate 100. The notch 100N may be formed in the round corner of the substrate 100. As an example, as shown in FIG. 4, the notch 100N may be formed in each of four round corners of the substrate 100. An interval (referred to a first interval ds1, hereinafter) from the edge of the display area DA to the edge of the substrate 100 may be maintained relatively constant. Because the notch 100N is formed by removing a portion of the substrate 100, a second interval ds2 from the edge of the display area DA corresponding to the notch 100N to the edge of the substrate 100, may be less than the first interval ds1.

The display panel 10 may include the main display area MDA and the first to fourth side display areas SDA1, SDA2, SDA3, and SDA4. As described above with reference to FIGS. 1 to 3, the first to fourth side display areas SDA1, SDA2, SDA3, and SDA4 may each have an image plane different from the image plane of the main display area MDA.

The display area DA may display images by using light emitted from light-emitting diodes LED arranged in the display area DA. Each light-emitting diode LED arranged in the display area DA may be electrically connected to a sub-pixel circuit PC arranged in the display area DA. The sub-pixel circuit PC may include a signal line, transistors and a capacitor electrically connected to a power line, wherein the signal line may control turning on/off and brightness, and the like of the light-emitting diode LED. As an example, as shown in FIG. 4, the sub-pixel circuit PC may be electrically connected to a scan line GW, an emission control line EM, a compensation gate line GC, an initialization gate line GI, a data line DL, and a driving voltage line PL. Though FIG. 4 shows the light-emitting diode LED and the sub-pixel circuit PC arranged in the main display area MDA, light-emitting diodes LEDs and sub-pixel circuits PCs may be arranged also in the first to fourth side display areas SDA1, SDA2, SDA3, and SDA4.

A common voltage supply line VSSL, a driving voltage supply line VDDL, a first driver circuitry 1100, a second driver circuitry 1200, a data driver circuitry 2000, and a first terminal portion TD1, may be arranged in the peripheral area PA.

The common voltage supply line VSSL may have a loop shape having one open side and partially surrounding the edges of the display area DA. As an example, the common voltage supply line VSSL may have a loop shape having one open side, extending along a portion of the third side display area SDA3, the second side display area SDA2, the first side display area SDA1, and the fourth side display area SDA4, and corresponding to the first terminal portion TD1.

The driving voltage supply line VDDL may be located between a side of the display area DA and the first terminal portion TD1. With regard to this, though it is shown that the driving voltage supply line VDDL is arranged between the third side display area SDA3 and the first terminal portion TD1, the driving voltage supply line VDDL may further include a portion arranged between the first side display area SDA1 and the edge of the substrate 100 in another embodiment. The driving voltage line PL crossing the display area DA may be electrically connected to the driving voltage supply line VDDL.

The first driver circuitry 1100 and the second driver circuitry 1200 may be arranged in the peripheral area PA, and adjacent to two opposite sides of the display area DA, respectively. The first driver circuitry 1100 may be adjacent to the second side display area SDA2, and the second driver circuitry 1200 may be adjacent to the fourth side display area SDA4.

The first driver circuitry 1100 may include multiple drivers. Some of the drivers may be scan drivers that provide scan signals to the scan line GW, others may be emission control drivers that provide emission control signals to the emission control line EM, and others may be gate drivers that provide signals to the compensation gate line GC and the initialization gate line GI.

Most of the drivers included in the first driver circuitry 1100 may be arranged in the peripheral area PA along the extension direction of the second side display area SDA2, and some of the drivers may be apart from most of the drivers. With regard to this, it is shown in FIG. 4 that the first driver circuitry 1100 includes a second sub-driver circuit 1120, a first sub-driver circuit 1110, and a third sub-driver circuit 1130, the first sub-driver circuit 1110 and the third sub-driver circuit 1130 being apart from the second sub-driver circuit 1120. The second sub-driver circuit 1120 corresponds to a region in which most of the drivers described above may be arranged, and the third sub-driver circuit 1130 and the first sub-driver circuit 1110 each correspond to a region in which the drivers apart by a preset interval from drivers of the second sub-driver circuit 1120 may be arranged. The first sub-driver circuit 1110 may be arranged along the round corner of the display area DA to be apart by a preset interval from the second sub-driver circuit 1120 with the notch 100N therebetween. Similarly, the third sub-driver circuit 1130 may be arranged along the corner of the display area DA to be apart by a preset interval from the second sub-driver circuit 1120 with the notch 100N therebetween.

Similarly, most of the drivers included in the second driver circuitry 1200 may be arranged in the peripheral area PA along the extension direction of the fourth side display area SDA4, and some of the drivers may be apart from most of the drivers. The arrangement of the drivers of the second driver circuitry 1200 may be symmetrical with the arrangement of the drivers of the first driver circuitry 1100. As an example, the first driver circuitry 1100 and the second driver circuitry 1200 may be symmetric with respect to a virtual line extending in a y direction and passing through the center of the main display area MDA of FIG. 4.

With regard to this, it is shown in FIG. 4 that the second driver circuitry 1200 includes a second sub-driver circuit 1220, a first sub-driver circuit 1210, and a third sub-driver circuit 1230, the first sub-driver circuit 1210 and the third sub-driver circuit 1230 being apart from the second sub-driver circuit 1220. The second sub-driver circuit 1220 corresponds to a region in which most of the drivers described above may be arranged, and the first sub-driver circuit 1210 and the third sub-driver circuit 1230 each correspond to a region in which the drivers apart by a preset interval from drivers of the second sub-driver circuit 1220 may be arranged. The first sub-driver circuit 1210 may be arranged along the corner of the display area DA to be apart by a preset interval from the second sub-driver circuit 1220 with the notch 100N therebetween. Similarly, the third sub-driver circuit 1230 may be arranged along the corner of the display area DA to be apart by a preset interval from the second sub-driver circuit 1120 with the notch 100N therebetween.

The data driver circuitry 2000 may transfer a data signal to one of the transistors of the sub-pixel circuit PC through the data line DL passing across the display area DA. The data driver circuitry 2000 may be arranged between the first terminal portion TD1 and the third side display area SDA3.

The first terminal portion TD1 may be located on a side of the substrate 100. A printed circuit board 3000 may be attached on the first terminal portion TD1. The printed circuit board 3000 may include a second terminal portion TD2 electrically connected to the first terminal portion TD1. A controller 4000 may be disposed on the printed circuit board 3000. Control signals of the controller 4000 may be provided to the first and second driver circuitries 1100 and 1200, the data driver circuitry 2000, the driving voltage supply line VDDL, and the common voltage supply line VSSL through the first and second terminal portions TD1 and TD2.

Figure 5:
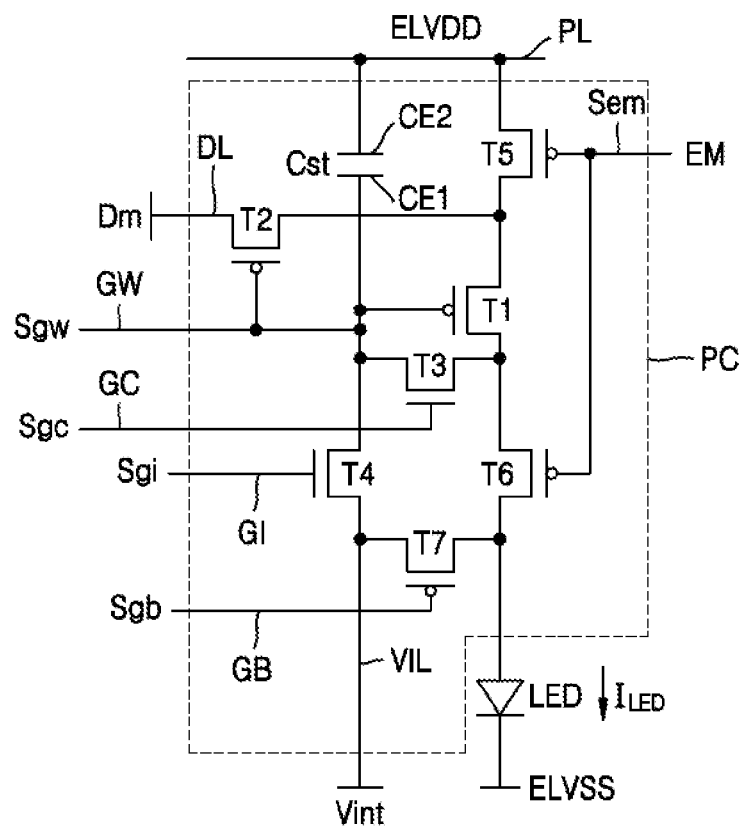
FIG. 5 is a schematic circuit diagram of a light-emitting diode and a sub-pixel circuit electrically connected to the light-emitting diode, arranged in a display area of a display apparatus according to an embodiment.

FIG. 5 is a schematic circuit diagram of a light-emitting diode and a sub-pixel circuit electrically connected to the light-emitting diode arranged in the display area DA of the display apparatus 1 according to an embodiment.

Referring to FIG. 5, the light-emitting diode LED may be electrically connected to the sub-pixel circuit PC. The sub-pixel circuit PC may include a driving thin-film transistor T1, a scan thin-film transistor T2, a compensation thin-film transistor T3, a gate initialization thin-film transistor T4, an operation control thin-film transistor T5, an emission control thin-film transistor T6, an anode initialization thin-film transistor T7, and a storage capacitor Cst.

The light-emitting diode LED may include an organic light-emitting diode including an organic emission layer. In another embodiment, the light-emitting diode may be an inorganic light-emitting diode including an inorganic material. The inorganic light-emitting diode may include a PN-junction diode including inorganic material semiconductor-based materials. In case that a forward voltage is applied to a PN-junction diode, holes and electrons may be injected and energy created by recombination of the holes and the electrons is converted to light energy, and thus, light of a preset color may be emitted. The inorganic light-emitting diode may have a width of several micrometers to hundreds of micrometers, or several nanometers to hundreds of nanometers. An emission layer of the light-emitting diode may include the organic material or inorganic material. In another embodiment, the emission layer of the light-emitting diode may include quantum dots. In other words, the light-emitting diode may be a quantum-dot light-emitting diode.

In an embodiment, at least one of the driving thin-film transistor T1, the scan thin-film transistor T2, the compensation thin-film transistor T3, the gate initialization thin-film transistor T4, the operation control thin-film transistor T5, the emission control thin-film transistor T6, and the anode initialization thin-film transistor T7 may be n-channel metal oxide (NMOS) field-effect transistors (MOSFETs), and the rest may be p-channel MOSFETs. As an example, as shown in FIG. 5, the compensation thin-film transistor T3 and the gate initialization thin-film transistor T4 may be n-channel MOSFETs, and the rest may be p-channel MOSFETs. The compensation thin-film transistor T3 and the gate initialization thin-film transistor T4 may include an oxide semiconductor layer, and the rest may include a silicon semiconductor layer.

In another embodiment, the compensation thin-film transistor T3, the gate initialization thin-film transistor T4, and the anode initialization thin-film transistor T7 may be n-channel MOSFETs, and the rest may be p-channel MOSFETs. In other embodiments, only one of the thin-film transistors T1, T2, T3, T4, T5, T6, and T7 may be an n-channel MOSFET (NMOS) and the rest may be p-channel MOSFETs (PMOSs). In other embodiments, all of the thin-film transistors T1, T2, T3, T4, T5, T6, and T7 may be n-channel MOSFET (NMOS).

The sub-pixel circuit PC may be electrically connected to multiple signal lines and a voltage line. The signal lines may include a scan line GW, a compensation gate line GC, an initialization gate line GI, an emission control line EM, a next scan line GB, and a data line DL. The scan line GW may transfer scan signals Sgw, the compensation gate line GC may transfer compensation signals Sgc, the initialization gate line GI may transfer initialization signals Sgi to the gate initialization thin-film transistor T4, the emission control line EM may transfer emission control signals Sem to the operation control thin-film transistor T5 and the emission control thin-film transistor T6, the next scan line GB may transfer next scan signals Sgb to the anode initialization thin-film transistor T7, and the data line DL crosses the scan line GW and may transfer a data signal Dm.

The driving voltage line PL may transfer a driving voltage ELVDD to the driving thin-film transistor T1, and an initialization voltage line VIL may transfer an initialization voltage Vint initializing the driving thin-film transistor T1 and the anode.

A gate of the driving thin-film transistor T1 may be connected to the storage capacitor Cst, a source of the driving thin-film transistor T1 may be connected to the driving voltage line PL through the operation control thin-film transistor T5, and a drain of the driving thin-film transistor T1 may be electrically connected to the anode of the light-emitting diode LED through the emission control thin-film transistor T6. The driving thin-film transistor T1 may receive a data signal Dm and supply a driving current $I_{LED}$ to the light-emitting diode LED according to a switching operation of the scan thin-film transistor T2.

A gate of the scan thin-film transistor T2 may be connected to the scan line GW, a source of the scan thin-film transistor T2 may be connected to the data line DL, and a drain of the scan thin-film transistor T2 may be connected to the source of the driving thin-film transistor T1 and connected to the driving voltage line PL through the operation control thin-film transistor T5. The scan thin-film transistor T2 may be turned on according to a scan signal Sgw transferred through the scan line GW and performs a switching operation of transferring a data voltage Dm to the source of the driving thin-film transistor T1, wherein the data signal Dm may be transferred to the data line DL.

A gate of the compensation thin-film transistor T3 may be connected to a compensation gate line GC. A drain of the compensation thin-film transistor T3 may be connected to the drain of the driving thin-film transistor T1 and connected to the anode of the light-emitting diode LED through the emission control thin-film transistor T6. A source of the compensation thin-film transistor T3 may be connected to a lower electrode CE1 of the storage capacitor Cst and the gate of the driving thin-film transistor T1. The source of the compensation thin-film transistor T3 may be connected to a drain of the gate initialization thin-film transistor T4. The compensation thin-film transistor T3 may be turned on according to a compensation signal Sgc transferred through the compensation gate line GC, and diode-connects the driving thin-film transistor T1 by electrically connecting the gate of the driving thin-film transistor T1 to the drain of the driving thin-film transistor T1.

A gate of the gate initialization thin-film transistor T4 may be connected to the initialization gate line GI. A source of the gate initialization thin-film transistor T4 may be connected to a source of the anode initialization thin-film transistor T7 and the initialization voltage line VIL. A drain of the gate initialization thin-film transistor T4 may be connected to the lower electrode CE1 of the storage capacitor Cst, the source of the compensation thin-film transistor T3, and the gate of the driving thin-film transistor T1. The gate initialization thin-film transistor T4 may be turned on according to an initialization signal Sgi transferred through the initialization gate line GI and performs an initialization operation of initializing a voltage of the gate of the driving thin-film transistor T1 by transferring the initialization voltage Vint to the gate of the driving thin-film transistor T1.

A gate of the operation control thin-film transistor T5 may be connected to the emission control line EM, a source of the operation control thin-film transistor T5 may be connected to the driving voltage line PL, and a drain of the operation control thin-film transistor T5 may be connected to the source of the driving thin-film transistor T1 and the drain of the scan thin-film transistor T2.

A gate of the emission control thin-film transistor T6 may be connected to the emission control line EM, a source of the emission control thin-film transistor T6 may be connected to the drain of the driving thin-film transistor T1 and the drain of the compensation thin-film transistor T3, and a drain of the emission control thin-film transistor T6 may be electrically connected to a drain of the anode initialization thin-film transistor T7 and the anode of light-emitting diode LED.

The operation control thin-film transistor T5 and the emission control thin-film transistor T6 may be simultaneously turned on according to an emission control signal Sem transferred through the emission control line EM, and the driving voltage ELVDD may be transferred to the light-emitting diode LED, and thus, the driving current $I_{LED}$ flows through the light-emitting diode LED.

A gate of the anode initialization thin-film transistor T7 may be connected to the next scan line GB, a drain of the anode initialization thin-film transistor T7 may be connected to the drain of the emission control thin-film transistor T6 and the anode of the light-emitting diode LED, and a source of the anode initialization thin-film transistor T7 may be connected to the source of the gate initialization thin-film transistor T4 and the initialization voltage line VIL. The anode initialization thin-film transistor T7 may be turned on according to a next scan signal Sgb transferred through the next scan line GB and initializes the anode of the light-emitting diode LED. Though it is shown in FIG. 5 that the same initialization voltage line VIL may be electrically connected to the gate initialization thin-film transistor T4 and the anode initialization thin-film transistor T7, the disclosure is not limited thereto. In another embodiment, an initialization voltage line electrically connected to the anode initialization thin-film transistor T7 may be different from an initialization voltage line electrically connected to the gate initialization thin-film transistor T4. In other words, an initialization voltage applied to the initialization thin-film transistor T7 may be different from an initialization voltage applied to the gate initialization thin-film transistor T4.

A next scan signal Sgb may be substantially synchronized with a scan signal Sgw. As another example, a next scan signal Sgb may be substantially synchronized with a scan signal Sgw on a next row. As an example, the next scan line GB may be substantially the same as a scan line GW on a next row. The pixels PX adjacent to each other in a column direction may share the scan line GW.

The anode initialization thin-film transistor T7 may be connected to the next scan line GB as shown in FIG. 5. In another embodiment, the anode initialization thin-film transistor T7 may be connected to the emission control line EM and driven according to an emission control signal Sem. The positions of a source and a drain of each of the thin-film transistors may be changed to each other depending on the type (a p-type or an n-type) of the transistor.

The storage capacitor Cst may include the lower electrode CE1 and an upper electrode CE2. The lower electrode CE1 of the storage capacitor Cst may be connected to the gate of the driving thin-film transistor T1, and the upper electrode CE2 of the storage capacitor Cst is connected to the driving voltage line PL. The storage capacitor Cst may store charge corresponding to a difference between the gate voltage of the driving thin-film transistor T1 and the driving voltage ELVDD.

Specific operations of the sub-pixel circuit PC and the light-emitting diode LED according to an embodiment are described below.

During an initialization period, in case that an initialization signal Sgi is supplied through the initialization gate line GI, the gate initialization thin-film transistor T4 may be turned on according to the initialization signal Sgi, and the driving thin-film transistor T1 may be initialized by the initialization voltage Vint supplied from the initialization voltage line VIL.

During a data programming period, in case that a scan signal Sgw and a compensation signal Sgc are supplied through the scan line GW and the compensation gate line GC, the scan thin-film transistor T2 and the compensation thin-film transistor T3 may be turned on according to a scan signal Sgw and a compensation signal Sgc. The driving thin-film transistor T1 may be diode-connected and forward-biased by the compensation thin-film transistor T3 that may be turned on.

A compensation voltage Dm+Vth (Vth has a −value) may be applied to the gate of the driving thin-film transistor T1, wherein the compensation voltage Dm+Vth may be a voltage reduced by a threshold voltage Vth of the driving thin-film transistor T1 from a data signal Dm supplied from the data line DL.

The driving voltage ELVDD and the compensation voltage Dm+Vth may be respectively applied to two opposite ends of the storage capacitor Cst, and charge corresponding to a difference between voltages of the two opposite ends may be stored in the storage capacitor Cst.

During an emission period, the operation control thin-film transistor T5 and the emission control thin-film transistor T6 may be turned on according to an emission control signal Sem supplied from the emission control line EM. The driving current $I_{LED}$ corresponding to a voltage difference between the gate voltage of the driving thin-film transistor T1 and the driving voltage ELVDD occurs, and the driving current $I_{LED}$ may be supplied to the light-emitting diode LED through the emission control thin-film transistor T6.

Figure 6:
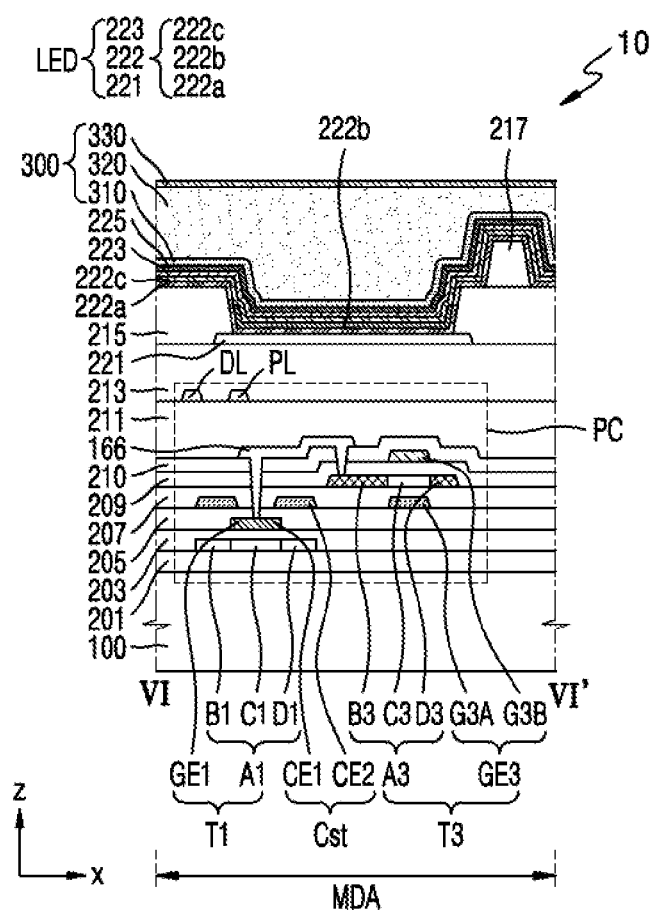
FIG. 6 is a schematic cross-sectional view of a portion of the display apparatus of FIG. 4, taken along line VI-VI' in FIG. 4, according to an embodiment.

FIG. 6 is a schematic cross-sectional view of a portion of the display apparatus 1, taken along line VI-VI' of FIG. 4, according to an embodiment. Though FIG. 6 shows the sub-pixel circuit PC and the light-emitting diode LED located in the main display area MDA, the disclosure is not limited thereto. The sub-pixel circuit PC and the light-emitting diode LED arranged in the first to fourth side display areas SDA1, SDA2, SDA3, and SDA4 described with reference to FIG. 4, may have the structure shown in FIG. 6.

Referring to FIG. 6, the sub-pixel circuit PC may be disposed on the substrate 100, and the light-emitting diode LED may be disposed on the sub-pixel circuit PC.

The substrate 100 may include glass or polymer resin. As an example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, and/or the like.

The substrate 100 including the polymer resin may be flexible, rollable, and/or bendable. The substrate 100 may have a multi-layered structure including a layer that includes the polymer resin and an inorganic layer (not shown).

A buffer layer 201 may be disposed on the upper surface of the substrate 100. The buffer layer 201 may prevent impurities from penetrating into a semiconductor layer of a transistor. The buffer layer 201 may include an inorganic insulating material such as silicon nitride, silicon oxynitride, and/or silicon oxide, and include a single layer or a multi-layer including the above inorganic insulating materials.

The sub-pixel circuit PC may be disposed on the buffer layer 201. As described above with reference to FIG. 5, the sub-pixel circuit PC may include the transistors and the storage capacitor. With regard to this, FIG. 6 shows the driving thin-film transistor T1, the compensation thin-film transistor T3, and the storage capacitor Cst.

The driving thin-film transistor T1 may include a semiconductor layer (referred to as a first semiconductor layer A1) on the buffer layer 201, and a gate electrode (referred to as a first gate electrode GE1) overlapping a channel region C1 of the first semiconductor layer A1. The first semiconductor layer A1 may include a silicon-based semiconductor material, for example, polycrystalline silicon. The first semiconductor layer A1 may include the channel region C1, a first region B1, and a second region D1 respectively arranged on two opposite sides of the channel region C1. The first region B1 and the second region D1 may be regions including impurities of higher concentration than that of the channel region C1. One of the first region B1 and the second region D1 may correspond to a source region, and the other may correspond to a drain region.

A first gate insulating layer 203 may be arranged between the first semiconductor layer A1 and the first gate electrode GE1. The first gate insulating layer 203 may include an inorganic insulating material such as silicon nitride, silicon oxynitride, and/or silicon oxide, and include a single-layered structure or a multi-layered structure including the above inorganic insulating materials.

The first gate electrode GE1 may include a conductive material including molybdenum (Mo), aluminum (Al), copper (Cu), and/or titanium (Ti) and have a single-layered structure or a multi-layered structure including the above materials.

The storage capacitor Cst may include the lower electrode CE1 and the upper electrode CE2 overlapping each other. In an embodiment, the lower electrode CE1 of the storage capacitor Cst may include the first gate electrode GE1. In other words, the first gate electrode GE1 may include the lower electrode CE1 of the storage capacitor Cst. As an example, the first gate electrode GE1 and the lower electrode CE1 of the storage capacitor Cst may be one body.

A first interlayer insulating layer 205 may be disposed between the lower electrode CE1 and the upper electrode CE2 of the storage capacitor Cst. The first interlayer insulating layer 205 may include an inorganic insulating material such as silicon nitride, silicon oxynitride, and/or silicon oxide, and include a single-layered structure or a multi-layered structure including the above inorganic insulating materials.

The upper electrode CE2 of the storage capacitor Cst may include a conductive material of a low-resistance material such as molybdenum (Mo), aluminum (Al), copper (Cu) and/or titanium (Ti), and have a single-layered structure or a multi-layered structure including the above materials.

A second interlayer insulating layer 207 may be disposed on the storage capacitor Cst. The second interlayer insulating layer 207 may include an inorganic insulating material such as silicon nitride, silicon oxynitride, and/or silicon oxide, and include a single-layered structure or a multi-layered structure including the above inorganic insulating materials.

A semiconductor layer (referred to as a third semiconductor layer A3) of the compensation thin-film transistor T3 may be disposed on the second interlayer insulating layer 207. The third semiconductor layer A3 may include an oxide-based semiconductor material. As an example, the third semiconductor layer A3 may include Zn-oxide-based material, for example, include Zn-oxide, In—Zn oxide, and Ga—In—Zn oxide. In an embodiment, the third semiconductor layer A3 may include In—Ga—Zn—O (IGZO), In—Sn—Zn—O (ITZO), or In—Ga—Sn—Zn—O (IG-TZO) semiconductor containing metal such as indium (In), gallium (Ga), and stannum (Sn) in ZnO.

The third semiconductor layer A3 may include a channel region C3, a first region B3, and a second region D3 respectively arranged on two opposite sides of the channel region C3. One of the first region B3 and the second region D3 may correspond to a source region, and the other may correspond to a drain region.

The compensation thin-film transistor T3 may include a gate electrode (referred to as a third gate electrode GE3, hereinafter) overlapping the channel region C3 of the third semiconductor layer A3. The third gate electrode GE3 may have a double gate structure including a lower gate electrode G3A and an upper gate electrode G3B, wherein the lower gate electrode G3A may be below the third semiconductor layer A3, and the upper gate electrode G3B may be over the channel region C3.

The lower gate electrode G3A may be on the same layer (e.g., the first interlayer insulating layer 205) as a layer on which the upper electrode CE2 of the storage capacitor Cst may be arranged. The lower gate electrode G3A may include the same material as that of the upper electrode CE2 of the storage capacitor Cst.

The upper gate electrode G3B may be disposed over the third semiconductor layer A3 with a second gate insulating layer 209 therebetween. The second gate insulating layer 209 may include an inorganic insulating material such as silicon nitride, silicon oxynitride, and/or silicon oxide, and include a single-layered structure or a multi-layered structure including the above inorganic insulating materials.

A third interlayer insulating layer 210 may be disposed on the upper gate electrode G3B. The third interlayer insulating layer 210 may include an inorganic insulating material such as silicon oxynitride, and have a single layer or a multi-layer including the inorganic insulating materials.

Though it is shown in FIG. 6 that the upper electrode CE2 of the storage capacitor Cst is arranged on the same layer as the lower gate electrode G3A of the third gate electrode GE3, the disclosure is not limited thereto. In another embodiment, the upper electrode CE2 of the storage capacitor Cst may be arranged on the same layer as the third semiconductor layer A3, and may include the same material as that of the first region B3 and the second region D3 of the third semiconductor layer A3.

The driving thin-film transistor T1 may be electrically connected to the compensation thin-film transistor T3 through a node connection line 166. The node connection line 166 may be disposed on the third interlayer insulating layer 210. A side of the node connection line 166 may be connected to the first gate electrode GE1 of the driving thin-film transistor T1, and another side of the node connection line 166 may be connected to the first region B3 of third semiconductor layer A3 of the compensation thin-film transistor T3.

The node connection line 166 may include aluminum (Al), copper (Cu), and/or titanium (Ti), and include a single layer or a multi-layer including the above materials. As an example, the node connection line 166 may have a triple-layered structure of titanium layer/aluminum layer/titanium layer.

A first organic insulating layer 211 may be disposed on the node connection line 166. The first organic insulating layer 211 may include an organic insulating material. The organic insulating material may include acryl, benzocyclobutene (BCB), polyimide, and/or hexamethyldisiloxane (HMDSO).

The data line DL and the driving voltage line PL may be disposed on the first organic insulating layer 211 and covered by a second organic insulating layer 213. The data line DL and the driving voltage line PL may include aluminum (Al), copper (Cu), and/or titanium (Ti), and include a single layer or a multi-layer including the above materials. As an example, the data line DL and the driving voltage line PL may each have a triple-layered structure of titanium layer/ aluminum layer/titanium layer.

The second organic insulating layer 213 may include acryl, BCB, polyimide, and/or HMDSO. Though it is shown in FIG. 6 that the data line DL and the driving voltage line PL are disposed on the first organic insulating layer 211, the disclosure is not limited thereto. In another embodiment, one of the data line DL and the driving voltage line PL may be disposed on the same layer (e.g., the third interlayer insulating layer 210) as a layer on which the node connection line 166 may be disposed.

In another embodiment, an additional organic insulating layer may be further disposed between the first organic insulating layer 211 and the second organic insulating layer 213. One of the data line DL and the driving voltage line PL may be disposed between the first organic insulating layer 211 and the additional organic insulating layer, and another of the data line DL and the driving voltage line PL may be disposed between the additional organic insulating layer and the second organic insulating layer 213.

A first electrode 221 of the light-emitting diode LED may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the first electrode 221 may further include a conductive oxide material layer on and/or under the reflective layer. The conductive oxide material layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the first electrode 221 may have a triple-layered structure of ITO layer/Ag layer/ITO layer.

A bank layer 215 may be disposed on the first electrode 221. The bank layer 215 may include an opening that overlaps the first electrode 221 and cover the edges of the first electrode 221. The bank layer 215 may include an organic insulating material such as polyimide.

A spacer 217 may be formed on the bank layer 215. The spacer 217 may be formed together during the same process as a process of forming the bank layer 215, or formed separately during a separate process. In an embodiment, the spacer 217 may include an organic insulating material such as polyimide. In other embodiments, the bank layer 215 may include an organic insulating material including a light-blocking dye, and the spacer 217 may include an organic insulating material such as polyimide.

An intermediate layer 222 may include an emission layer 222b. The intermediate layer 222 may include a first functional layer 222a and/or a second functional layer 222c, wherein the first functional layer 222a may be under the emission layer 222b, and the second functional layer 222c may be on the emission layer 222b.

The emission layer 222b may include a polymer organic material or a low-molecular weight organic material emitting light having a preset color. In another embodiment, the emission layer 222b may include an inorganic material or quantum dots.

The second functional layer 222c may include an electron transport layer (ETL) and/or an electron injection layer (EIL). The first functional layer 222a and the second functional layer 222c may each include an organic material.

The second electrode 223 may include a conductive material having a low work function. As an example, the second electrode 223 may include a (semi) transparent layer including at least one of silver (Ag), magnesium (Mg), aluminum (Al), platinum (Pt), palladium (Pd), gold (Au), nickel (Ni), neodymium (Nd), iridium (Ir), chrome (Cr), or an alloy thereof. In other embodiments, the second electrode 223 may further include a layer on the (semi) transparent layer, the layer including ITO, IZO, ZnO, and/or $In_2O_3$.

The emission layer 222b may be formed in the display area DA to overlap the first electrode 221 through the opening of the bank layer 215. In contrast, an organic material layer, for example, the first functional layer 222a and the second functional layer 222c included in the intermediate layer 222, may cover the display area DA entirely. The second electrode 223 may cover the display area DA entirely.

The capping layer 225 may be disposed on the second electrode 223. The capping layer 225 may include an inorganic material or an organic material. The capping layer 225 may include lithium fluoride (LiF), an inorganic insulating material and/or an organic insulating material. The capping layer 225 may cover the display area DA entirely.

The light-emitting diode LED including the first electrode 221, the intermediate layer 222, and the second electrode 223 may be covered by an encapsulation layer 300. The encapsulation layer 300 may include at least one organic encapsulation layer and at least one inorganic encapsulation layer. In an embodiment, it is shown in FIG. 6 that the encapsulation layer 300 includes first and second inorganic encapsulation layers 310 and 330, and an organic encapsulation layer 320 therebetween. However, the disclosure is not limited thereto. The encapsulation layer 300 may be disposed on the capping layer 225.

The first and second inorganic encapsulation layer 310 and 330 may include at least one inorganic material among aluminum oxide, titanium oxide, tantalum oxide, hafnium oxide, zinc oxide, silicon oxide, silicon nitride, silicon oxynitride, and/or the like.

The first and second inorganic encapsulation layer 310 and 330 may include a single layer or a multi-layer including the above materials. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

The thickness of the first inorganic encapsulation layer 310 may be different from that of the second inorganic encapsulation layer 330. The thickness of the first inorganic encapsulation layer 310 may be greater than that of the second inorganic encapsulation layer 330. In other embodiments, the thickness of the second inorganic encapsulation layer 330 may be greater than that of the first inorganic encapsulation layer 310, or the thickness of the first inorganic encapsulation layer 310 may be the same as that of the second inorganic encapsulation layer 330.

Figure 7:
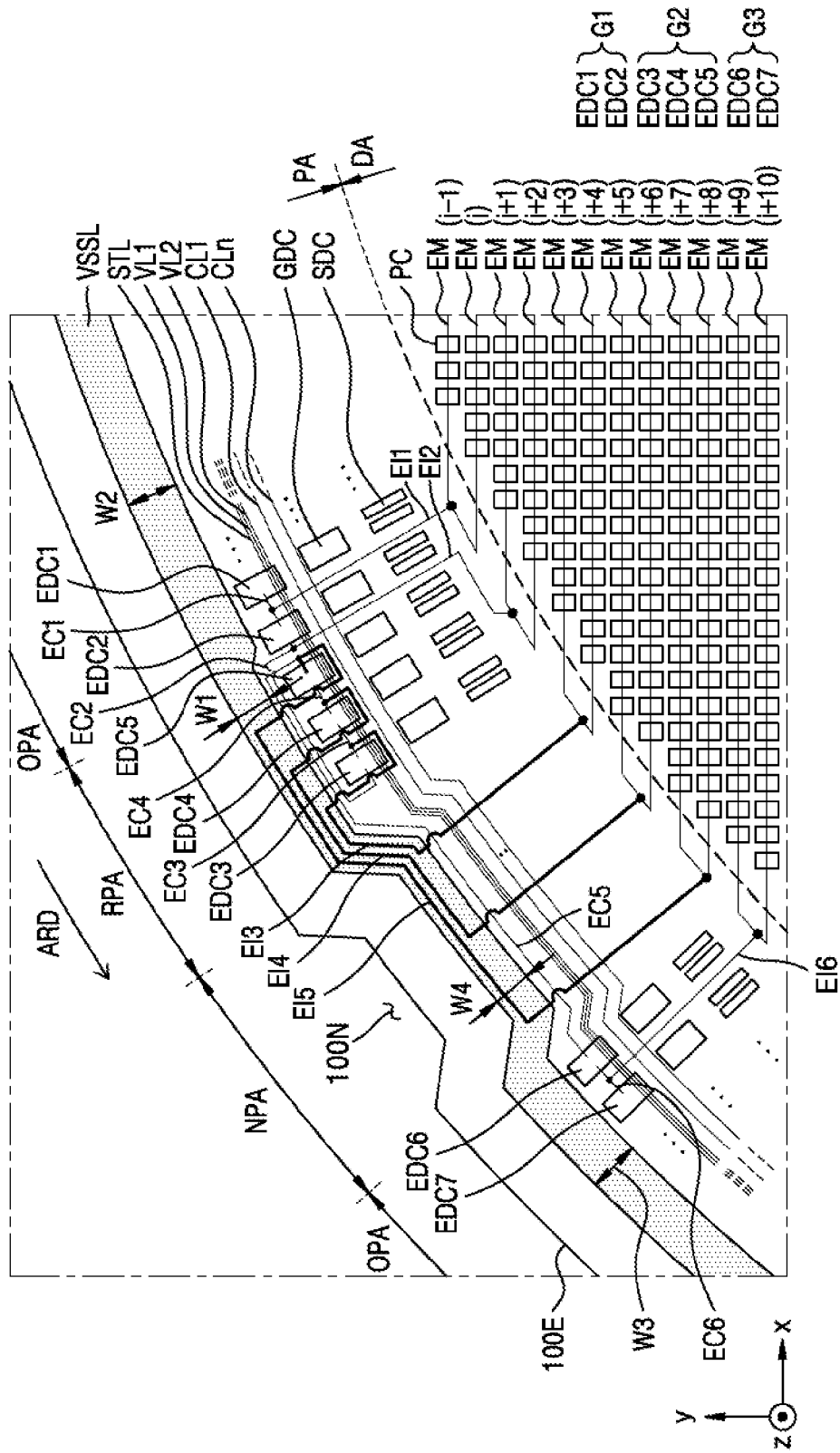
FIG. 7 is an enlarged schematic plan view of a portion of a display apparatus according to an embodiment, showing light emission-controlling drivers and wirings electrically connected to the light emission-controlling drivers.

FIG. 7 is an enlarged schematic plan view of a portion of the display apparatus according to an embodiment, showing light emission-controlling drivers and wirings electrically connected to the light emission-controlling drivers. FIG. 7 corresponds to region IV of FIG. 4.

Referring to FIG. 7, the sub-pixel circuits PC may be arranged in the display area DA. The sub-pixel circuits PC may be arranged to form rows and columns, and the sub-pixel circuits PC adjacent to the round corner may have a stepwise configuration in a plan view. Though the sub-pixel circuits PC may be respectively electrically connected to the light-emitting diodes arranged in the display area DA as described with reference to FIG. 4, the light-emitting diodes are omitted in FIG. 7, for convenience of description.

The sub-pixel circuits PC arranged on the same row in a first direction (e.g., an x direction or a row direction) may be electrically connected to the same signal line extending in the first direction in the display area DA. As an example, the sub-pixel circuits PC arranged on the same row in the first direction may be electrically connected to the same emission control line EM. With regard to this, FIG. 7 shows the sub-pixel circuits PC on an (i−1)st row, an i-th row, . . . , an (i+10)-th row, and the emission control lines EM passing through each row.

Multiple drivers may be arranged in the peripheral area PA. The drivers may include emission control drivers, for example, first to seventh emission control drivers EDC1, EDC2, EDC3, EDC4, EDC5, EDC6, and EDC7 electrically connected to the emission control lines EMs passing across the display area DA. The drivers may include gate drivers GDC and scan drivers SDC. Connection between the gate drivers GDC and the scan drivers SDC, and signal lines is described below with reference to FIGS. 9 and 12.

The drivers may include a first driver group G1, a second driver group G2, and a third driver group G3. The first driver group G1, the second driver group G2, and the third driver group G3 may be arranged along the round corner of the display area DA.

As an example, the first driver group G1, the second driver group G2, and the third driver group G3 may be arranged in a first arrangement direction ARD of a counter-clockwise direction. A separation region NPA may be disposed between the second driver group G2 and the third driver group G3.

The first driver group G1 and the second driver group G2 may correspond to a portion of the first sub-driver circuit 1110 of the first driver circuitry 1100 (see FIG. 4) described above with reference to FIG. 4, and the third driver group G3 may correspond to a portion of the second sub-driver circuit 1120 of the first driver circuitry 1100 (see FIG. 4) described above with reference to FIG. 4.

The first driver group G1 may include multiple drivers, for example, multiple emission control drivers arranged in the first arrangement direction ARD, for example, a counterclockwise direction in FIG. 7. With regard to this, FIG. 7 shows the first and second emission control drivers EDC1 and EDC2 included in the first driver group G1. The first and second emission control drivers EDC1 and EDC2 may be arranged in the first arrangement direction ARD.

An emission control signal, which may be a driving signal output from the first emission control driver EDC1, may be transferred to the emission control line EM arranged on an i-th row through a signal connection line, for example, a first signal connection line Eli. An emission control signal output from the first emission control driver EDC1, may be transferred to also the emission control line EM arranged on an (i−1)-th row through the first signal connection line Eli. The first signal connection line Eli may be arranged in the peripheral area PA, and may electrically connect an output terminal of the first emission control driver EDC1 to the emission control lines EM arranged on the i-th row and the (i−1)-th row.

A carry signal output from the first emission control driver EDC1 may be input to the second emission control driver EDC2 adjacent to the first emission control driver EDC1 through a first carry signal line EC1. The first carry signal line EC1 may be arranged in the peripheral area PA and may electrically connect the output terminal of the first emission control driver EDC1 to an input end of the second emission control driver EDC2.

An emission control signal output from the second emission control driver EDC2 may be transferred to the emission control line EM through a signal connection line, for example, the second signal connection line EI2 according to a carry signal. The emission control line EM that receives an emission control signal from the second emission control driver EDC2, may be disposed lower than the emission control line EM that receives an emission control signal from the first emission control driver EDC1.

As an example, an emission control signal output from the second emission control driver EDC2, may be transferred to the emission control line EM arranged on an (i+j)-th row (j may be a natural number) through the second signal connection line EI2. In an embodiment, as shown in FIG. 7, an emission control signal output from the second emission control driver EDC2, may be transferred to the emission control line EM arranged on an (i+1)st row and the emission control line EM arranged on an (i+2)nd row through the second signal connection line EI2. The second signal connection line EI2 may be arranged in the peripheral area PA, and may electrically connect an output terminal of the second emission control driver EDC2 to the emission control lines EM arranged on the (i+1)st row and the (i+2)nd row.

The emission control drivers included in the first driver group G1 may be arranged in the first arrangement direction ARD and may transfer a carry signal in the first arrangement direction ARD. As an example, the first emission control driver EDC1 and the second emission control driver EDC2 may be arranged in the first arrangement direction ARD, and a carry signal output from the first emission control driver EDC1 may be transferred from the first emission control driver EDC1 to the second emission control driver EDC2, for example, in the first arrangement direction ARD.

The second driver group G2 may include multiple drivers, for example, multiple emission control drivers arranged in a direction (for example, a clockwise direction in FIG. 7) opposite to the first arrangement direction ARD. With regard to this, FIG. 7 shows a third emission control driver EDC3 in the second driver group G2 farthest away from the first driver group G1, a fourth emission control driver EDC4 adjacent to the third emission control driver EDC3 in the direction opposite to the first arrangement direction ARD, and a fifth emission control driver EDC5 adjacent to the fourth emission control driver EDC4 in the direction opposite to the first arrangement direction ARD. Because, for convenience of description, it is shown in FIG. 7 that the second driver group G2 includes three emission control drivers, a driver closest to the first driver group G1 among the drivers of the second driver group G2, may be the fifth emission control driver EDC5. Though it is shown in FIG. 7 that the second driver group G2 includes three drivers, the disclosure is not limited thereto. For convenience of description, though it is shown in FIG. 7 that the second driver group G2 includes three emission control drivers, the second driver group G2 may include four or more emission control drivers in another embodiment.

A carry signal output from the second emission control driver EDC2 closest to the second driver group G2 among the drivers of the first driver group G1, may be input to the third emission control driver EDC3 through a second carry signal line EC2. The second carry signal line EC2 may be arranged in the peripheral area PA and may electrically connect the output terminal of the second emission control driver EDC2 to an input end of the third emission control driver EDC3.

An emission control signal, which may be a driving signal output from the third emission control driver EDC3 may be transferred to the emission control line EM through a signal connection line, for example, the third signal connection line EI3 according to a carry signal. The emission control line EM that receives an emission control signal from the third emission control driver EDC3, may be disposed lower than the emission control line EM that receives an emission control signal from the second emission control driver EDC2. As an example, an emission control signal output from the third emission control driver EDC3, may be transferred to the emission control line EM arranged on an (i+n)-th row (n may be a natural number greater than j) through the third signal connection line EI3. In an embodiment, as shown in FIG. 7, an emission control signal output from the third emission control driver EDC3, may be transferred to the emission control line EM arranged on an (i+3)rd row and the emission control line EM arranged on an (i+4)-th row through the third signal connection line EI3. The third signal connection line EI3 may be arranged in the peripheral area PA, and may electrically connect an output terminal of the third emission control driver EDC3 to the emission control lines EM arranged on the (i+3)rd row and the (i+4)-th row.

The third signal connection line EI3 may be bent multiple times and may extend to the display area DA beyond the separation region NPA. A portion of the third signal connection line EI3 may be arranged between the second driver group G2 and the third driver group G3, for example, in the separation region NPA.

A carry signal output from the third emission control driver EDC3 may be input to the fourth emission control driver EDC4 through a third carry signal line EC3. The third carry signal line EC3 may be arranged in the peripheral area PA and may electrically connect the output terminal of the third emission control driver EDC3 to an input end of the fourth emission control driver EDC4.

An emission control signal, which may be a driving signal output from the fourth emission control driver EDC4 may be transferred to the emission control line EM through a signal connection line, for example, a fourth signal connection line EI4 according to a carry signal. The emission control line EM that receives an emission control signal from the fourth emission control driver EDC4, may be disposed below the emission control line EM that receives an emission control signal from the third emission control driver EDC3. As an example, an emission control signal output from the fourth emission control driver EDC4, may be transferred to the emission control line EM arranged on an (i+m)-th row (m may be a natural number greater than m) through the fourth signal connection line EI4. In an embodiment, as shown in FIG. 7, an emission control signal output from the fourth emission control driver EDC4, may be transferred to the emission control line EM arranged on an (i+5)-th row and the emission control line EM arranged on an (i+6)-th row through the fourth signal connection line EI4.

The fourth signal connection line EI4 may be arranged in the peripheral area PA, and may electrically connect an output terminal of the fourth emission control driver EDC4 to the emission control lines EM arranged on the (i+5)-th row and the (i+6)-th row. The fourth signal connection line EI4 may be bent multiple times and may extend to the display area DA beyond the separation region NPA. A portion of the fourth signal connection line EI4 may be arranged between the second driver group G2 and the third driver group G3, for example, in the separation region NPA.

A carry signal output from the fourth emission control driver EDC4 may be input to the fifth emission control driver EDC5 through a fourth carry signal line EC4. The fourth carry signal line EC4 may be arranged in the peripheral area PA and may electrically connect the output terminal of the fourth emission control driver EDC4 to an input end of the fifth emission control driver EDC5.

An emission control signal output from the fifth emission control driver EDC5 may be transferred to the emission control line EM through a signal connection line, for example, a fifth signal connection line EI5 according to a carry signal. The emission control line EM that receives an emission control signal from the fifth emission control driver EDC5, may be disposed below the emission control line EM that receives an emission control signal from the fourth emission control driver EDC4. As an example, an emission control signal output from the fifth emission control driver EDC5, may be transferred to the emission control line EM arranged on an (i+p)-th row (p may be a natural number greater than m) through the fifth signal connection line EI5. In an embodiment, as shown in FIG. 7, an emission control signal output from the fifth emission control driver EDC5, may be transferred to the emission control line EM arranged on an (i+7)-th row and the emission control line EM arranged on an (i+8)-th row through the fifth signal connection line EI5.

The fifth signal connection line EI5 may be arranged in the peripheral area PA, and may electrically connect an output terminal of the fifth emission control driver EDC5 to the emission control lines EM arranged on the (i+7)-th row and the (i+8)-th row. The fifth signal connection line EI5 may be bent multiple times and may extend to the display area DA beyond the separation region NPA. A portion of the fifth signal connection line EI5 may be arranged between the second driver group G2 and the third driver group G3, for example, in the separation region NPA.

The arrangement of the second driver group G2 and the transfer direction of a carry signal may be opposite to the arrangement of the first driver group G1 and the transfer direction of a carry signal. As described above, the arrangement of the drivers of the first driver group G1 and the transfer direction of a carry signal may be the first arrangement direction ARD, while the arrangement of the drivers of the second driver group G2 and the transfer direction of a carry signal may be opposite to the first arrangement direction ARD.

The emission control drivers included in the second driver group G2 may be arranged in a direction opposite to the first arrangement direction ARD and may transfer a carry signal in the direction opposite to the first arrangement direction ARD. As an example, the third emission control driver EDC3 and the fourth emission control driver EDC4 may be arranged in the direction opposite to the first arrangement direction ARD, and a carry signal output from the third emission control driver EDC3 may be transferred in the direction opposite to the first arrangement direction ARD. Similarly, the fourth emission control driver EDC4 and the fifth emission control driver EDC5 may be arranged in the direction opposite to the first arrangement direction ARD, and a carry signal output from the fourth emission control driver EDC4 may be transferred in the direction opposite to the first arrangement direction ARD.

A carry signal output from an output terminal of the fifth emission control driver EDC5, may be provided to a driver closest to the second driver group G2 among the drivers of the third driver group G3 through a fifth carry signal line EC5. As an example, a carry signal output from an output terminal of the fifth emission control driver EDC5, may be input to a sixth emission control driver EDC6 of the third driver group G3 through the fifth carry signal line EC5. The fifth carry signal line EC5 may be arranged in the peripheral area PA and may electrically connect the output terminal of the fifth emission control driver EDC5 to an input end of the sixth emission control driver EDC6. The fifth carry signal line EC5 may pass across the separation region NPA.

The third driver group G3 may include multiple drivers, for example, emission control drivers arranged in the first arrangement direction ARD (for example, a counterclockwise direction in FIG. 7). With regard to this, FIG. 7 shows the sixth and seventh emission control drivers EDC6 and EDC7 included in the third driver group G3. The sixth and seventh emission control drivers EDC6 and EDC7 may be arranged in the first arrangement direction ARD.

An emission control signal, which is a driving signal output from the sixth emission control driver EDC6 may be transferred to the emission control line EM through a signal connection line, for example, the sixth signal connection line EI6. The emission control line EM that receives an emission control signal from the sixth emission control driver EDC6, may be disposed lower than the emission control line EM that receives an emission control signal from the fifth emission control driver EDC5.

As an example, an emission control signal output from the sixth emission control driver EDC6, may be transferred to the emission control line EM arranged on an (i+q)-th row (q may be a natural number greater than p) through the sixth signal connection line EI6. In an embodiment, as shown in FIG. 7, an emission control signal output from the sixth emission control driver EDC6, may be transferred to the emission control line EM arranged on an (i+9)-th row and the emission control line EM arranged on an (i+10)-th row through the sixth signal connection line EI6. The sixth signal connection line EI6 may be arranged in the peripheral area PA, and may electrically connect an output terminal of the sixth emission control driver EDC6 to the emission control lines EM arranged on the (i+9)-th row and the (i+10)-th row.

A carry signal output from the sixth emission control driver EDC6 may be input to the seventh emission control driver EDC7 through a sixth carry signal line EC6. The sixth carry signal line EC6 may be arranged in the peripheral area PA and may electrically connect the output terminal of the sixth emission control driver EDC6 to an input end of the seventh emission control driver EDC7.

As described above, the arrangement of the third driver group G3 and the transfer direction of a carry signal may be the same as the arrangement of the first driver group G1 and the transfer direction of a carry signal. As described above, like the arrangement of the drivers of the first driver group G1 and the transfer direction of a carry signal are the first arrangement direction ARD, the arrangement of the drivers of the third driver group G3 and the transfer direction of a carry signal may be the first arrangement direction ARD.

Referring to the arrangement of the drivers and the transfer direction of the carry signal, it may be understood that the peripheral area PA may include an ordinary peripheral area OPA, a reverse peripheral area RPA, and the separation region NPA. The ordinary peripheral area OPA may be a region in which drivers that provide carry signals may be arranged in the first arrangement direction ARD. The reverse peripheral area RPA may be a region in which drivers that provide carry signals may be arranged in the direction opposite to the first arrangement direction ARD. The separation region NPA may be a non-driver area in which drivers may not be arranged and may correspond to a region in which the notch 100N may be arranged. As an example, a region between the notch 100N and the display area DA may correspond to the separation region NPA. The width of the separation region NPA, for example, a distance between the edge of the display area DA and the edge of the substrate 100, corresponds to a second interval ds2 (see FIG. 4) described above with reference to FIG. 4.

Because the first and second signal connection lines Eli and EI2 respectively extend from the output terminals of the first and second emission control drivers EDC1 and EDC2 to the display area DA, the first and second signal connection lines Eli and EI2 may not pass across the separation region NPA. Similarly, because the sixth signal connection line EI6 extends from the output terminal of the sixth emission control driver EDC6 to the display area DA, the sixth signal connection line EI6 may not pass across the separation region NPA.

The third to fifth signal connection lines EI3, EI4, and EI5 extending from the output terminals of the third to fifth emission control drivers EDC3, EDC4, and EDC5 arranged in the reverse peripheral area RPA, may pass across the separation region NPA, for electric connection to the emission control line EM arranged on the corresponding row. As an example, the third to fifth signal connection lines EI3, EI4, and EI5 may extend in the first arrangement direction ARD between the third to fifth emission control drivers EDC3, EDC4, and EDC5, and an edge 100E of the substrate 100, be bent along the notch 100N, extend to the display area DA, be bent again, and extend. The separation region NPA may be a wiring region across which lines such as the third to fifth signal connection lines EI3, EI4, and EI5, and the fifth carry signal line EC5 pass.

The common voltage supply line VSSL may be located between the drivers and the edge 100E of the substrate 100, and may extend along the edge 100E of the substrate 100. The common voltage supply line VSSL may include a first portion between the second driver group G2 and the edge 100E of the substrate 100, a second portion between the first driver group G1 and the edge 100E of the substrate 100, a third portion between the third driver group G3 and the edge 100E of the substrate 100, and a fourth portion between the notch 100N and the display area DA. The first to fourth portions of the common voltage supply line VSSL may be connected as one body.

A portion of each of the third to fifth signal connection lines EI3, EI4, and EI5 may overlap the first portion of the common voltage supply line VSSL. Because the common voltage supply line VSSL has a constant voltage, the third to fifth signal connection lines EI3, EI4, and EI5 may be protected from external electrostatic discharge and the like.

In an embodiment, a width W1 of the first portion of the common voltage supply line VSSL may be less than a width W2 of the second portion. The width W1 of the first portion of the common voltage supply line VSSL may be substantially the same as the width W4 of the fourth portion, and the width W3 of the third portion may be substantially the same as the width W1 of the first portion. In another embodiment, the width W1 of the first portion of the common voltage supply line VSSL may be less than the width W2 of the second portion.

For electric connection with the emission control line EM, the signal connection lines bent in the separation region NPA, for example, the third to fifth signal connection lines EI3, EI4, and EI5 may cross wirings that provide signals or voltages to the emission control drivers. With regard to this, it is shown in FIG. 7 that each of the third to fifth signal connection lines EI3, EI4, and EI5 crosses an initialization signal line STL, the first voltage line VL1 applying a high voltage, the second voltage line VL2 applying a low voltage, and/or clock signal lines CL1, ..., CLn that transfers clock signals in the separation region NPA. A portion of each of the third to fifth signal connection lines EI3, EI4, and EI5 may overlap the initialization signal line STL, the first voltage line VL, the second voltage line VL2, and/or the clock signal lines CL1, ..., CLn in the separation region NPA. At least one insulating layer may be disposed between the third to fifth signal connection lines EI3, EI4, and EI5 and a line overlapping thereto (e.g., the initialization signal line STL, the third to fifth signal connection lines EI3, EI4, and EI5, the first voltage line VL1, the second voltage line VL2, and/or the clock signal lines CL1, ..., CLn).

The initialization signal line STL, the first voltage line VL1, the second voltage line VL2, and/or the clock signal lines CL1, ..., CLn may extend in a direction along the edge of the display area DA, and cross the separation region NPA. The initialization signal line STL may transfer an initialization signal that initializes driving of one of emission control drivers. The first voltage line VL1 and the second voltage line VL2 may respectively transfer a high voltage and a low voltage to the emission control drivers. The clock signal lines CL1, ..., CLn may transfer a clock signal to a corresponding emission control driver.

Though it is shown in FIG. 7 that the first portion of the common voltage supply line VSSL does not overlap the second carry signal line EC2 and the fifth carry signal line EC5, the first portion of the common voltage supply line VSSL may overlap the second carry signal line EC2 and the fifth carry signal line EC5 in another embodiment.

Figure 8:
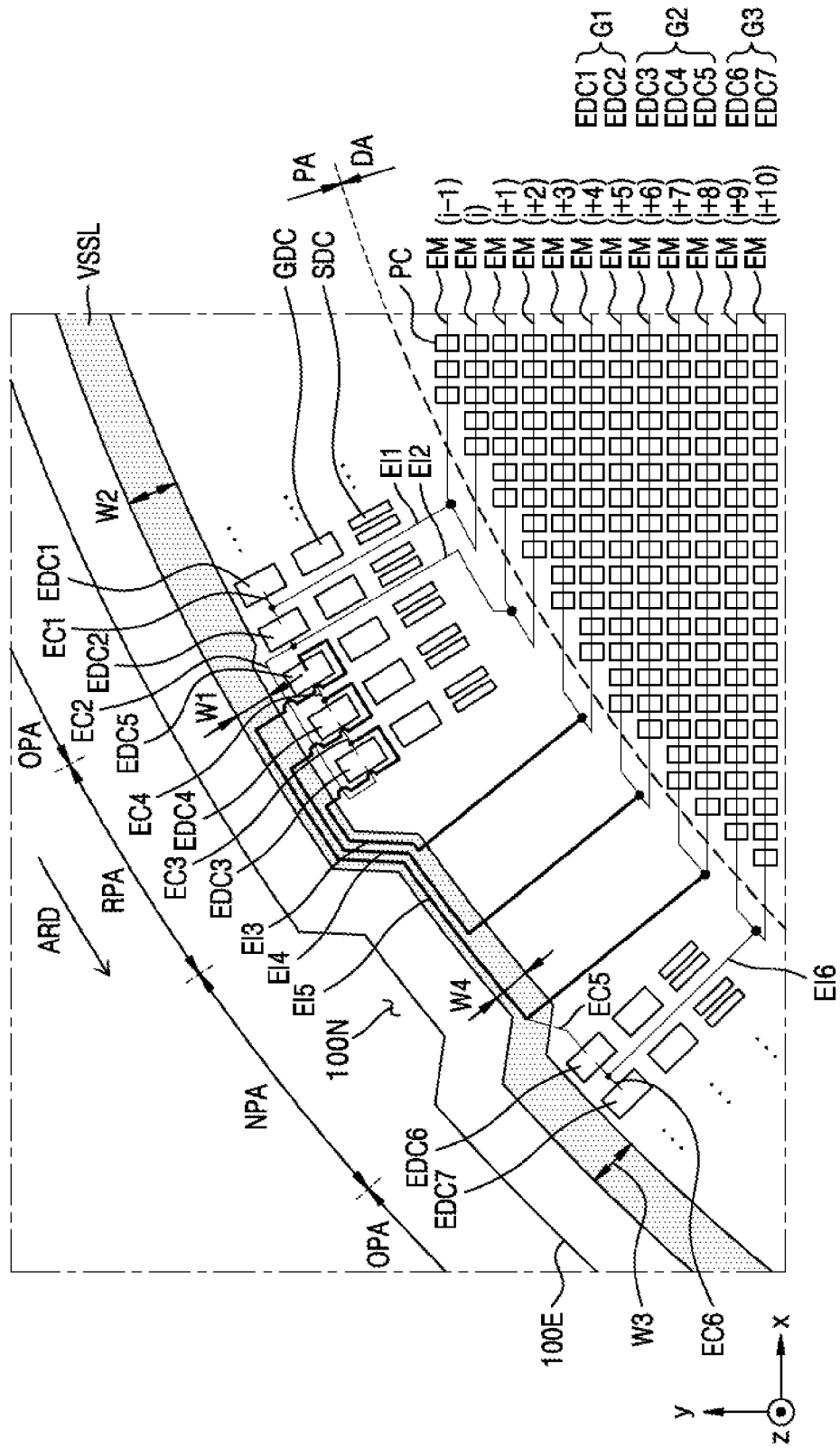
FIG. 8 is an enlarged schematic plan view of a display apparatus according to another embodiment.

FIG. 8 is an enlarged schematic plan view of a display apparatus according to another embodiment and corresponds to region IV of FIG. 4. Because the other constructions except for the fifth carry signal line EC5 in the plan view of FIG. 8 may be the same as the structure of FIG. 7, differences are described below.

According to an embodiment described above with reference to FIG. 7, though it is described that the fifth carry signal line EC5 extends from the output terminal of the fifth emission control driver EDC5, the disclosure is not limited thereto. In another embodiment, as shown in FIG. 8, the fifth carry signal line EC5 may branch from the fifth signal connection line EI5. In other words, the fifth carry signal line EC5 may be a kind of branch wiring extending from the fifth signal connection line EI5.

Figure 9:
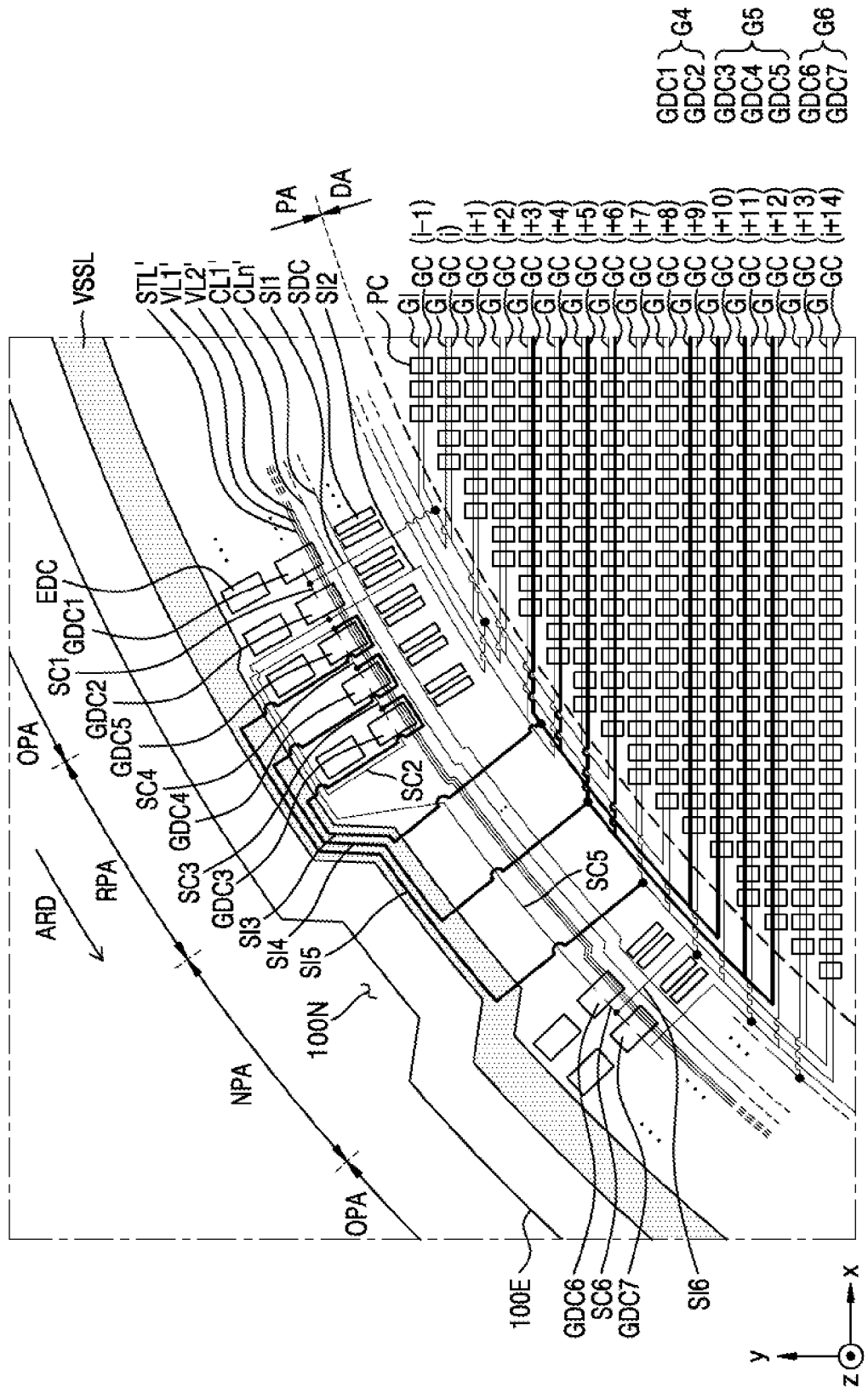
FIG. 9 is an enlarged schematic plan view of a portion of a display apparatus according to an embodiment, showing gate drivers and wirings electrically connected to the gate drivers.

FIGS. 7 and 8 describe the emission control drivers, which may be some of the drivers arranged in the peripheral area PA, and lines extending from the emission control drivers. FIG. 9 below describes gate drivers, which are others of the drivers arranged in the peripheral area PA, and lines extending from the gate drivers.

FIG. 9 is an enlarged schematic plan view of a portion of the display apparatus according to an embodiment, showing gate drivers and wirings electrically connected to the gate drivers. FIG. 9 corresponds to region IV of FIG. 4. Though the display apparatus shown in FIG. 9 may be substantially the same as the display apparatus shown in FIGS. 7 and 8, FIG. 9 describes the gate drivers and lines extending from the gate drivers, for convenience of description.

The sub-pixel circuits PC arranged on the same row in a first direction (e.g., an x direction or a row direction) may be electrically connected to the same signal line extending in the first direction in the display area DA. As an example, the sub-pixel circuits PC arranged on the same row in the first direction may be electrically connected to the same compensation gate line GC and initialization gate line GI. With regard to this, FIG. 9 shows the sub-pixel circuits PC on an (i−1)st row, an i-th row, ..., an (i+10)-th row, and the compensation gate lines GC, and the initialization gate lines GI passing through each row.

The drivers arranged in the peripheral area PA may include gate drivers arranged closer to the display area DA than the emission control drivers EDC. With regard to this, FIG. 9 shows first to seventh gate drivers GDC1, GDC2, GDC3, GDC4, GDC5, GDC6, and GDC7. The first to seventh gate drivers GDC1, GDC2, GDC3, GDC4, GDC5, GDC6, and GDC7 may provide signals different from those provided by the emission control drivers EDC. As an example, a driving signal (e.g., a gate signal) output from the gate drivers may be a signal provided to the compensation thin-film transistor and the gate initialization thin-film transistor as described above with reference to FIG. 5, and a driving signal (e.g., an emission control signal) output from the emission control drivers EDC may be a signal provided to the operation control thin-film transistor and the emission control thin-film transistor as described above with reference to FIG. 5.

The drivers may include a fourth driver group G4, a fifth driver group G5, and a sixth driver group G6. The fourth driver group G4, the fifth driver group G5, and the sixth driver group G6 may be arranged along the round corner of the display area DA. As an example, the fourth driver group G4, the fifth driver group G5, and the sixth driver group G6 may be arranged in a first arrangement direction ARD. The separation region NPA may be disposed between the fifth driver group G5 and the sixth driver group G6. The fourth driver group G4 may be adjacent to the first driver group G1 in a direction from the display area DA toward the peripheral area PA. The fifth driver group G5 may be adjacent to the second driver group G2 in a direction from the display area DA toward the peripheral area PA. The sixth driver group G6 may be adjacent to the third driver group G3 in a direction from the display area DA toward the peripheral area PA.

The fourth driver group G4 and the fifth driver group G5 may correspond to a portion of the first sub-driver circuit 1110 of the first driver circuitry 1100 (see FIG. 4) described above with reference to FIG. 4, and the sixth driver group G6 may correspond to a portion of the second sub-driver circuit 1120 of the first driver circuitry 1100 (see FIG. 4) described above with reference to FIG. 4.

The fourth driver group G4 may include multiple drivers, for example, multiple gate control drivers arranged in the first arrangement direction ARD (for example, a counterclockwise direction in FIG. 9). With regard to this, FIG. 9 shows the first and second gate drivers GDC1 and GDC2 included in the fourth driver group G4. The first and second gate drivers GDC1 and GDC2 may be arranged in the first arrangement direction ARD.

A gate signal, which is a driving signal output from the first gate driver GDC1, may be transferred to the compensation gate line GC arranged on an i-th row through a signal connection line, for example, a first gate signal connection line SI1. A gate signal output from the first gate driver GDC1 may be transferred to the compensation gate line GC on an (i−1)st row and the initialization gate line GI on a (i+r)-th row (r may be a natural number greater than 1) through the first gate signal connection line SI1. With regard to this, it is shown in FIG. 9 that a gate signal output from the first gate driver GDC1 is connected to the compensation gate lines GC on the (i−1)st row and the i-th row, and the initialization gate lines GI on an (i+5)-th row and an (i+6)-th row.

The first gate signal connection line SI1 may be arranged in the peripheral area PA, and electrically connect an output terminal of the first gate driver GDC1 to the initialization gate lines GI and the compensation gate lines GC.

A carry signal output from the first gate driver GDC1 may be input to the second gate driver GDC2 through a carry signal line, for example, a first gate carry signal line SC1. The first gate carry signal line SC1 may be arranged in the peripheral area PA and may electrically connect the output terminal of the first gate driver GDC1 to an input end of the second gate driver GDC2.

A gate signal, which may be a driving signal output from the second gate driver GDC2 may be provided to the compensation gate lines GC and the initialization gate lines GI through a signal connection line, for example, the second gate signal connection line SI2 according to a carry signal. The compensation gate lines GC and the initialization gate lines GI that receive gate signals from the second gate driver GDC2, may be disposed below the compensation gate lines GC and the initialization gate lines GI that receive gate signals from the first gate driver GDC1. As an example, a gate signal output from the second gate driver GDC2 may be transferred to the compensation gate line GC on an (i+j')-th row (j' may be a natural number greater than 1) and the initialization gate line GI on an (i+s)-th row (s may be a natural number greater than r) through the second gate signal connection line SI2. In an embodiment, as shown in FIG. 9, a gate signal output from the second gate driver GDC2 may be transferred to the compensation gate lines GC on the (i+1)st row and (i+2)nd row, and the initialization gate lines GI on an (i+7)-th row and an (i+8)-th row through the second gate signal connection line SI2. The second gate signal connection line SI2 may be arranged in the peripheral area PA, and electrically connect an output terminal of the second gate driver GDC2 to the initialization gate lines GI and the compensation gate lines GC.

The gate drivers included in the fourth driver group G4 may be arranged in the first arrangement direction ARD and may transfer a carry signal in the first arrangement direction ARD. As an example, the first gate driver GDC1 and the second gate driver GDC2 may be arranged in the first arrangement direction ARD, and a carry signal output from the first gate driver GDC1 may be transferred from the first gate driver GDC1 to the second gate driver GDC2, for example, in the first arrangement direction ARD.

The fifth driver group G5 may include multiple drivers, for example, multiple emission control drivers arranged in a direction (for example, a clockwise direction in FIG. 9) opposite to the first arrangement direction ARD. With regard to this, FIG. 9 shows the third gate driver GDC3 farthest away from the fourth driver group G4, the fourth gate driver GDC4 adjacent to the third gate driver GDC3 in the direction opposite to the first arrangement direction ARD, and the fifth gate driver GDC5 adjacent to the fourth gate driver GDC4 in the direction opposite to the first arrangement direction ARD. Because, for convenience of description, it is shown in FIG. 9 that the fifth driver group G5 includes three gate drivers, a driver closest to the fourth driver group G4 among the drivers of the fifth driver group G5, may be the fifth gate driver GDC5. Though it is shown in FIG. 9 that the fifth driver group G5 includes three drivers, the disclosure is not limited thereto. For convenience of description, though it is shown in FIG. 9 that the fifth driver group G5 includes three gate drivers, the fifth driver group G5 may include four or more gate drivers in another embodiment.

A carry signal output from the second gate driver GDC2 closest to the fifth driver group G5 among the drivers of the fourth driver group G4, may be input to the third gate driver GDC3 through a carry signal line, for example, the second gate carry signal line SC2. The second gate carry signal line SC2 may be arranged in the peripheral area PA and may electrically connect the output terminal of the second gate driver GDC2 to an input end of the third gate driver GDC3.

A gate signal, which may be a driving signal output from the third gate driver GDC3 may be provided to the compensation gate lines GC and the initialization gate lines GI through a signal connection line, for example, the third gate signal connection line SI3 according to a carry signal. The compensation gate lines GC and the initialization gate lines GI that receive gate signals from the third gate driver GDC3, may be disposed below the compensation gate lines GC and the initialization gate lines GI that receive gate signals from the second gate driver GDC2. As an example, a gate signal output from the third gate driver GDC3 may be transferred to the compensation gate line GC on an (i+n')-th row (n' may be a natural number greater than j') and the initialization gate line GI on an (i+t)-th row (t may be a natural number greater than s) through the third gate signal connection line SI3. In an embodiment, as shown in FIG. 9, a gate signal output from the third gate driver GDC3 may be transferred to the compensation gate lines GC on the (i+3)rd row and (i+4)-th row, and the initialization gate lines GI on an (i+9)-th row and an (i+10)-th row through the third gate signal connection line SI3. The third gate signal connection line SI3 may be arranged in the peripheral area PA, and electrically connect an output terminal of the third gate driver GDC3 to the initialization gate lines GI and the compensation gate lines GC.

The third gate signal connection line SI3 may be bent multiple times and may extend to the display area DA beyond the separation region NPA. A portion of the third gate signal connection line SI3 may be arranged between the fifth driver group G5 and the sixth driver group G6, for example, in the separation region NPA.

A carry signal output from the third gate driver GDC3 may be input to the fourth gate driver GDC4 through a carry signal line, for example, a third gate carry signal line SC3. The third gate carry signal line SC3 may be arranged in the peripheral area PA and may electrically connect the output terminal of the third gate driver GDC3 to an input end of the fourth gate driver GDC4.

A gate signal output from the fourth gate driver GDC4 may be provided to the compensation gate lines GC and the initialization gate lines GI through a signal connection line, for example, the fourth gate signal connection line SI4 according to a carry signal. The compensation gate lines GC and the initialization gate lines GI that receive gate signals from the fourth gate driver GDC4, may be disposed below the compensation gate lines GC and the initialization gate lines GI that receive gate signals from the third gate driver GDC3. As an example, a gate signal output from the fourth gate driver GDC4 may be transferred to the compensation gate line GC on an (i+m')-th row (m' may be a natural number greater than n') and the initialization gate line GI on an (i+u)-th row (u may be a natural number greater than t) through the fourth gate signal connection line S4. In an embodiment, as shown in FIG. 9, a gate signal output from the fourth gate driver GDC4 may be transferred to the compensation gate lines GC on the (i+5)-th row and (i+6)-th row, and the initialization gate lines GI on an (i+11)-th row and an (i+12)-th row through the fourth gate signal connection line SI4.

The fourth gate signal connection line SI4 may be arranged in the peripheral area PA, and electrically connect an output terminal of the fourth gate driver GDC4 to the initialization gate lines GI and the compensation gate lines GC. The fourth gate signal connection line SI4 may be bent multiple times and may extend to the display area DA beyond the separation region NPA. A portion of the fourth gate signal connection line SI4 may be arranged between the fifth driver group G5 and the sixth driver group G6, for example, in the separation region NPA.

A carry signal output from the fourth gate driver GDC4 may be input to the fifth gate driver GDC5 through a carry signal line, for example, a fourth gate carry signal line SC4. The fourth gate carry signal line SC4 may be arranged in the peripheral area PA and may electrically connect the output terminal of the fourth gate driver GDC4 to an input end of the fifth gate driver GDC5.

A gate signal output from the fifth gate driver GDC5 may be provided to the compensation gate lines GC and the initialization gate lines GI through a signal connection line, for example, the fifth gate signal connection line SI5 according to a carry signal. The compensation gate line GC and the initialization gate line GI that receive gate signals from the fifth gate driver GDC5, may be disposed below the compensation gate line GC and the initialization gate line GI that receive gate signals from the fourth gate driver GDC4. As an example, a gate signal output from the fifth gate driver GDC5 may be transferred to the compensation gate line GC on an (i+p')-th row (p' may be a natural number greater than m') and the initialization gate line GI on an (i+v)-th row (v may be a natural number greater than u) through the fifth gate signal connection line SI5. In an embodiment, as shown in FIG. 9, a gate signal output from the fifth gate driver GDC5 may be transferred to the compensation gate lines GC on the (i+7)-th row and (i+8)-th row, and the initialization gate lines GI on an (i+13)-th row and an (i+14)-th row through the fifth gate signal connection line SI5.

The fifth gate signal connection line SI5 may be arranged in the peripheral area PA, and electrically connect an output terminal of the fifth gate driver GDC5 to the initialization gate lines GI and the compensation gate lines GC. The fifth gate signal connection line SI5 may be bent multiple times and may extend to the display area DA beyond the separation region NPA. A portion of the fifth gate signal connection line SI5 may be arranged between the fifth driver group G5 and the sixth driver group G6, for example, in the separation region NPA.

The arrangement of the fifth driver group G5 and the transfer direction of a carry signal may be opposite to the arrangement of the fourth driver group G4 and the transfer direction of a carry signal. As described above, the arrangement of the drivers of the fourth driver group G4 and the transfer direction of a carry signal may be the first arrangement direction ARD, while the arrangement of the drivers of the fifth driver group G5 and the transfer direction of a carry signal may be opposite to the first arrangement direction ARD.

The gate drivers included in the fifth driver group G5 may be arranged in a direction opposite to the first arrangement direction ARD and may transfer a carry signal in the direction opposite to the first arrangement direction ARD. As an example, the third gate driver GDC3 and the fourth gate driver GDC4 may be arranged in the direction opposite to the first arrangement direction ARD, and a carry signal output from the third gate driver GDC3 may be transferred in the direction opposite to the first arrangement direction ARD. Similarly, the fourth gate driver GDC4 and the fifth gate driver GDC5 may be arranged in the direction opposite to the first arrangement direction ARD, and a carry signal output from the fourth gate driver GDC4 may be transferred in the direction opposite to the first arrangement direction ARD.

A carry signal output from the fifth gate driver GDC5 may be input to the sixth gate driver GDC6 of the sixth driver group G6 through a carry signal line, for example, a fifth gate carry signal line SC5. The fifth gate carry signal line SC5 may be arranged in the peripheral area PA and may electrically connect the output terminal of the fifth gate driver GDC5 to an input end of the sixth gate driver GDC6. The fifth gate carry signal line SC5 may pass across the separation region NPA.

The sixth driver group G6 may include multiple drivers, for example, multiple gate control drivers arranged in the first arrangement direction ARD (for example, a counter-clockwise direction in FIG. 9). With regard to this, FIG. 9 shows the sixth and seventh gate drivers GDC6 and GDC7 included in the sixth driver group G6. The sixth and seventh gate drivers GDC6 and GDC7 may be arranged in the first arrangement direction ARD.

A gate signal output from the sixth gate driver GDC6 may be transferred to the compensation gate line GC and the initialization gate line GI through a signal connection line, for example, the sixth gate signal connection line SI6. The compensation gate line GC and the initialization gate line GI that receive gate signals from the sixth gate driver GDC6, may be disposed lower than the compensation gate line GC and the initialization gate line GI that receive gate signals from the fifth gate driver GDC5. As an example, a gate signal output from the sixth gate driver GDC6 may be transferred to the compensation gate line GC on an (i+q')-th row (q' may be a natural number greater than p') and the initialization gate line GI on an (i+w)-th row (w may be a natural number greater than v) through the sixth gate signal connection line SI6. In an embodiment, as shown in FIG. 9, a gate signal output from the sixth gate driver GDC6 may be transferred to the compensation gate lines GC on the (i+9)-th row and (i+10)-th row, and the initialization gate lines GI on an (i+15)-th row and an (i+16)-th row through the sixth gate signal connection line SI6.

The sixth gate signal connection line SI6 may be arranged in the peripheral area PA, and electrically connect an output terminal of the sixth gate driver GDC6 and the compensation gate lines GC to the initialization gate lines GI.

A carry signal output from the sixth gate driver GDC6 may be input to the seventh gate driver GDC7 through a carry signal line, for example, a sixth gate carry signal line SC6. The sixth gate carry signal line SC6 may be arranged in the peripheral area PA and may electrically connect the output terminal of the sixth gate driver GDC6 to an input end of the seventh gate driver GDC7.

As described above, the arrangement of the sixth driver group G6 and the transfer direction of a carry signal may be the same as the arrangement of the fourth driver group G4 and the transfer direction of a carry signal. As described above, like the arrangement of the drivers of the fourth driver group G4 and the transfer direction of a carry signal may be the first arrangement direction ARD, the arrangement of the drivers of the sixth driver group G6 and the transfer direction of a carry signal may be the first arrangement direction ARD.

Because the first and second gate signal connection lines SI1 and SI2 each extend from the output terminals of the first and second gate drivers GDC1 and GDC2 arranged in the ordinary peripheral area OPA to the display area DA, the first and second gate signal connection lines SI1 and SI2 may not pass across the separation region NPA. Similarly, because the sixth gate signal connection line SI6 extends from the output terminal of the sixth gate driver GDC6 to the display area DA, the sixth gate signal connection line SI6 may not pass across the separation region NPA.

In contrast, the third to fifth gate signal connection lines SI3, SI4, and SI5 extending from the output terminals of the third to fifth gate drivers GDC3, GDC4, and GDC5 arranged in the reverse peripheral area RPA, may pass across the separation region NPA, for electric connection to the compensation gate line GC and the initialization gate line GI arranged on the corresponding row. As an example, the third to fifth gate signal connection lines SI3, SI4, and SI5 may extend in the first arrangement direction ARD between the third to fifth gate drivers GDC3, GDC4, and GDC5, and the edge 100E of the substrate 100, be bent along the notch 100N, extend to the display area DA, then be bent again, and extend. The separation region NPA may be a wiring region across which lines such as the third to fifth gate signal connection lines SI3, SI4, and SI5, and the fifth gate carry signal line SC5 pass.

A portion of each of the third to fifth gate signal connection lines SI3, SI4, and SI5 may overlap the first portion of the common voltage supply line VSSL. Because the common voltage supply line VSSL has a constant voltage, the third to fifth gate signal connection lines SI3, SI4, and SI5 may be protected from external electrostatic discharge and the like.

For electric connection between the compensation gate line GC and the initialization gate line GI, the signal connection lines bent in the separation region NPA, for example, the third to fifth gate signal connection lines SI3, SI4, and SI5 may cross wirings that provide a signal or a voltage to the gate drivers. With regard to this, it is shown in FIG. 9 that each of the third to fifth gate signal connection lines SI3, SI4, and SI5 crosses an initialization signal line STL', a first voltage line VL1' applying a high voltage, a second voltage line VL2' applying a low voltage, and/or clock signal lines CL1', ..., CLn' that transfer clock signals in the separation region NPA. A portion of each of the third to fifth gate signal connection lines SI3, SI4, and SI5 may overlap the initialization signal line STL', the first voltage line VL1', the second voltage line VL2', and/or the clock signal lines CL1', ..., CLn' in the separation region NPA.

The initialization signal line STL, the first voltage line VL1', the second voltage line VL2', and/or the clock signal lines CL1', ..., CLn' may extend in a direction along the edge of the display area DA, and cross the separation region NPA. The initialization signal line STL' may transfer an initialization signal that initializes driving of one of gate drivers. The first voltage line VL1' and the second voltage line VL2' may respectively transfer a high voltage and a low voltage to the gate drivers. The clock signal lines CL1', ..., CLn' may transfer a clock signal to a corresponding gate driver.

Figure 10:
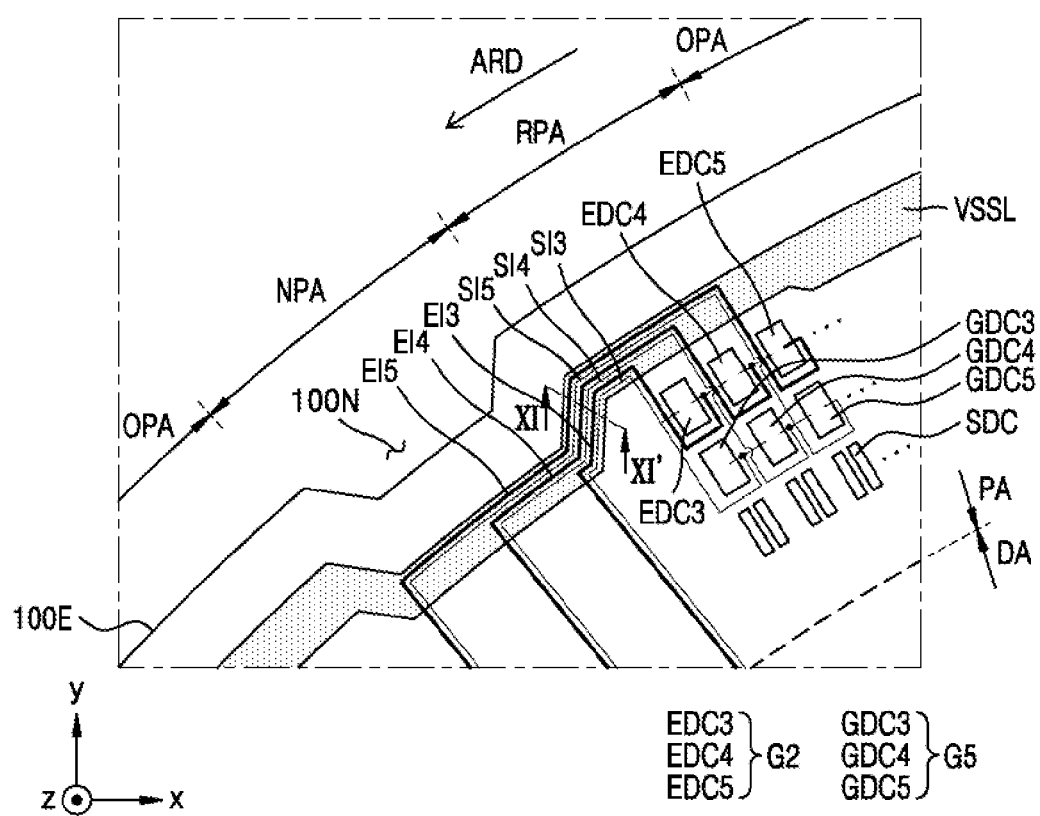
FIG. 10 is a schematic plan view of a portion of a display apparatus according to an embodiment, showing a common voltage supply line and signal connection lines disposed thereunder.
Figure 11:
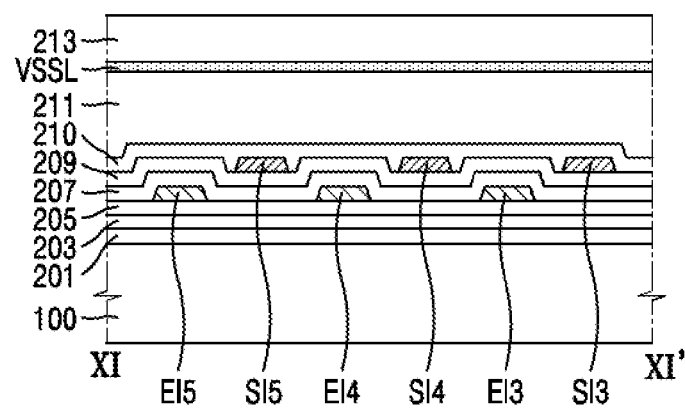
FIG. 11 is a schematic cross-sectional view of the display apparatus of FIG. 10, taken along line XI-XI' in FIG. 10.

FIG. 10 is a schematic plan view of a portion of a display apparatus according to an embodiment, showing a common voltage supply line and signal connection lines disposed thereunder, and FIG. 11 is a schematic cross-sectional view of the display apparatus, taken along line XI-XI' of FIG. 10. FIG. 10 shows the common voltage supply line VSSL and signal connection lines disposed therebelow, for example, the third to the fifth signal connection lines EI3, EI4, and EI5, and the third to fifth gate signal connection lines SI3, SI4, and SI5 shown in FIG. 7 (or 8) and FIG. 9.

As described above with reference to FIGS. 7 and 9, the third to the fifth signal connection lines EI3, EI4, and EI5, and the third to fifth gate signal connection lines SI3, SI4, and SI5 may overlap the first portion of the common voltage supply line VSSL.

Referring to FIG. 10, a signal connection line connected to the emission control driver and a gate signal connection line connected to the gate driver, may be alternately arranged below the common voltage supply line VSSL. As an example, the fourth gate signal connection line SI4 may be arranged between the third and fourth signal connection lines EI3 and EI4. The fifth gate signal connection line SI5 may be arranged between the fourth and fifth signal connection lines EI4 and EI5. The third signal connection line EI3 may be arranged between the third and fourth gate signal connection lines SI3 and S4. The fourth signal connection line EI4 may be arranged between the fourth and fifth gate signal connection lines SI4 and SI5.

A signal connection line and a gate signal connection line alternately arranged, may be respectively arranged on different layers. As an example, as shown in FIG. 11, the third to the fifth signal connection lines EI3, EI4, and EI5 may be disposed on the first interlayer insulating layer 205, and the third to fifth gate signal connection lines SI3, SI4, and SI5 may be disposed on the second gate insulating layer 209. In another embodiment, the third to the fifth signal connection lines EI3, EI4, and EI5 may be disposed on the second gate insulating layer 209, and the third to fifth gate signal connection lines SI3, SI4, and SI5 may be disposed on the first interlayer insulating layer 205. The common voltage supply line VSSL may be disposed on the signal connection line and the gate signal connection line. In an embodiment, as shown in FIG. 11, though the common voltage supply line VSSL may be disposed on the first organic insulating layer 211, the disclosure is not limited thereto. The common voltage supply line VSSL may be disposed between the third interlayer insulating layer 210 and the first organic insulating layer 211. In other embodiments, in the case where an additional organic insulating layer is disposed between the first organic insulating layer 211 and the second organic insulating layer 213, the common voltage supply line VSSL may be disposed between the additional organic insulating layer and the second organic insulating layer 213.

Figure 12:
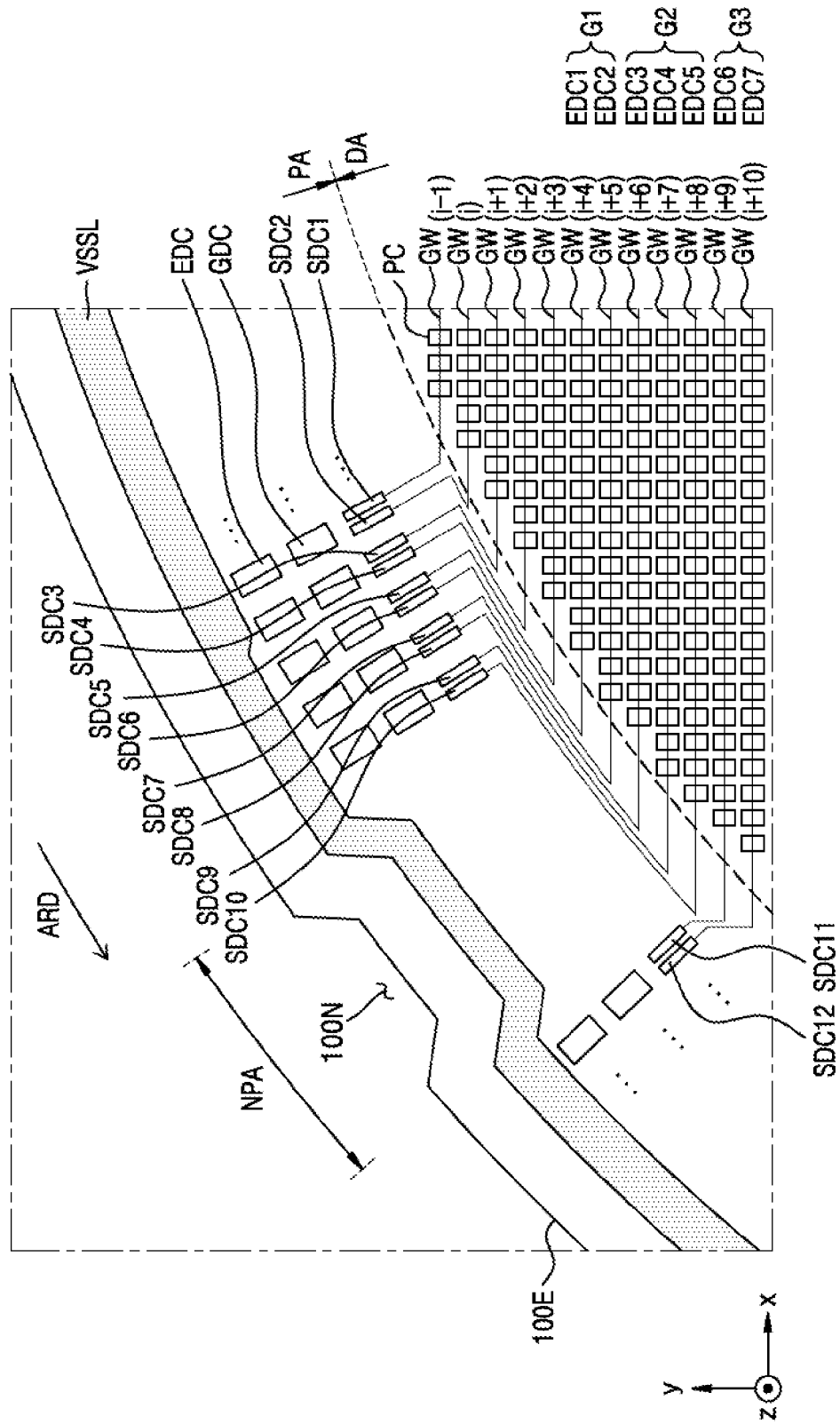
FIG. 12 is an enlarged schematic plan view of a portion of a display apparatus according to an embodiment, showing scan drivers and wirings electrically connected to the scan drivers.

FIG. 12 is an enlarged schematic plan view of a portion of a display apparatus according to an embodiment, showing scan drivers and wirings electrically connected to the scan drivers. FIG. 12 corresponds to region IV of FIG. 4. Though the display apparatus shown in FIG. 12 may be substantially the same as the display apparatus shown in FIGS. 7 and 9, FIG. 12 describes the scan drivers and lines extending from the scan drivers, for convenience of description.

According to an embodiment described above with reference to FIG. 7 (or 8) and FIG. 9, it is described that some of the emission control drivers and some of the gate drivers may be arranged in the direction opposite to the first arrangement direction ARD. However, as shown in FIG. 12, the scan drivers may be arranged in the first arrangement direction ARD. With regard to this, FIG. 12 shows first to eleventh scan drivers SDC1, SDC2, SDC3, SDC4, SDC5, SDC6, SDC7, SDC8, SDC9, SDC10, and SDC11.

The separation region NPA may be arranged between two scan drivers among the first to eleventh scan drivers SDC1, SDC2, SDC3, SDC4, SDC5, SDC6, SDC7, SDC8, SDC9, SDC10, and SDC11. In an embodiment, it is shown in FIG. 12 that the separation region NPA is arranged between the tenth scan driver SDC10 and the eleventh scan driver SDC11.

Two scan drivers may be arranged to correspond to one emission control driver EDC or one gate driver GDC. A scan signal emitted from each of the first to eleventh scan drivers SDC1, SDC2, SDC3, SDC4, SDC5, SDC6, SDC7, SDC8, SDC9, SDC10, and SDC11, may be provided to a scan line GW arranged on each row through the scan signal connection line. One scan driver arranged in the peripheral area PA may provide a scan signal to the scan line GW arranged on one row.

The display apparatus and the display panel according to an embodiment have the structures described with reference to FIG. 12, and thus, the round corner and/or the notch 100N may be included, the area of the peripheral area PA (the area of the dead space) may be reduced, and signals may be provided to the signal lines arranged on the respective rows.

FIGS. 7 to 10 show that drivers of first to third driver group G1, G2, and G3 provide signals to emission control lines EM and that drivers of fourth to sixth driver group G4, G5, and G6 provide signals to gate lines GC and/or initialization gate lines GI. However, the disclosure is not limited thereto. In some embodiments, the drivers of the first to third driver group G1, G2, and G3 provide signals to the gate lines GC and/or the initialization gate lines GI, and the drivers of the fourth to sixth driver group G4, G5, and G6 provide signals to the emission control lines EM.

According to an embodiment, a bendable display apparatus with a reduced dead space, which may prevent cracks, and provide high-quality images, may be provided. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of this disclosure.

What is claimed is:

1. A display apparatus comprising:
a substrate including a display area and a peripheral area, the display area including a round corner, and the peripheral area being outside the display area;
sub-pixel circuits disposed in the display area;
light-emitting diodes disposed in the display area and electrically connected to the sub-pixel circuits;
signal lines electrically connected to the sub-pixel circuits and each extending in a first direction in the display area; and
drivers disposed in the peripheral area and electrically connected to the signal lines, wherein
the drivers include:
a first driver group including a first driver and a second driver, the first driver being electrically connected to a signal line disposed on an i-th row (i is a natural number) among the signal lines, and the second driver being electrically connected to a signal line disposed on a (i+j)-th row (j is a natural number) among the signal lines and being adjacent to the first driver in a first arrangement direction;
a second driver group including a third driver and a fourth driver, the third driver being electrically connected to a signal line disposed on an (i+n)-th row (n is a natural number greater than j) among the signal lines, the fourth driver being electrically connected to a signal line disposed on a (i+m)-th row (m is a natural number greater than n) among the signal lines and being adjacent to the third driver in a direction opposite to the first arrangement direction; and
a third driver group adjacent to the second driver group in the first arrangement direction with a separation region between the second driver group and the third driver group, and the first driver group, the second driver group, and the third driver group are disposed along the round corner of the display area.

2. The display apparatus of claim 1, wherein
the second driver of the first driver group is a driver disposed closest to the second driver group,
the third driver of the second driver group is a driver disposed farthest away from the first driver group, and
a carry signal output from the second driver is transferred to the third driver through a carry signal line passing between the second driver group and an edge of the substrate.

3. The display apparatus of claim 1, wherein the sub-pixel circuits each include:
a driving thin-film transistor;
a compensation thin-film transistor that electrically connects a gate of the driving thin-film transistor to a drain of the driving thin-film transistor; and
a control thin-film transistor electrically connected to the driving thin-film transistor.

4. The display apparatus of claim 3, wherein the signal lines are electrically connected to a gate of the compensation thin-film transistor or a gate of the control thin-film transistor of each of the sub-pixel circuits.

5. The display apparatus of claim 1, wherein
a driving signal output from the third driver is transferred to the signal line disposed on the (i+n)-th row through a first signal connection line passing across the separation region, and
a driving signal output from the fourth driver is transferred to the signal line disposed on the (i+m)-th row through a second signal connection line passing across the separation region.

6. The display apparatus of claim 5, wherein a driving signal output from a driver disposed closest to the first driver group among drivers of the second driver group is transferred to a signal line disposed on an (i+p)-th row (p is a natural number greater than m) through a third signal connection line.

7. The display apparatus of claim 6, further comprising:
a common voltage supply line disposed in the peripheral area,
wherein a portion of the first signal connection line, a portion of the second signal connection line, and a portion of the third signal connection line each overlap a first portion of the common voltage supply line in the peripheral area.

8. The display apparatus of claim 7, wherein
the first portion of the common voltage supply line is disposed between the second driver group and an edge of the substrate,
a second portion of the common voltage supply line integrally connected to the first portion of the common voltage supply line is disposed between the first driver group and the edge of the substrate, and
a width of the second portion of the common voltage supply line is greater than a width of the first portion.

9. The display apparatus of claim 6, wherein a carry signal output from the driver disposed closest to the first driver group among drivers of the second driver group is transferred to a driver disposed closest to the second driver group among drivers of the third driver group through a carry signal line passing across the separation region.

10. The display apparatus of claim 9, wherein the driver disposed closest to the second driver group among drivers of the third driver group is electrically connected to a signal line disposed on an (i+q)-th row (q is a natural number greater than p) among the signal lines.

11. The display apparatus of claim 5, further comprising:
a fourth driver group disposed between the first driver group and the display area, and including drivers that provide signals different from signals of the drivers of the first driver group; and
a fifth driver group disposed between the second driver group and the display area, and including drivers that provide signals different from signals of the drivers of the second driver group,
wherein signal connection lines connected to an output terminal of each of the drivers of the fifth driver group pass across the separation region.

12. The display apparatus of claim 11, wherein a portion of one of the signal connection lines is disposed between the first signal connection line and the second signal connection line.

13. The display apparatus of claim 12, wherein a portion of one of the signal connection lines is disposed on a layer different from a layer on which the first signal connection line and the second signal connection line are disposed.

14. A display apparatus comprising:
a substrate including a display area, a peripheral area outside the display area, and a notch;
sub-pixel circuits disposed in the display area;
light-emitting diodes disposed in the display area and electrically connected to the sub-pixel circuits;
signal lines electrically connected to the sub-pixel circuits and each extending in a first direction in the display area; and
drivers disposed in the peripheral area and electrically connected to the signal lines, wherein
the drivers include:
a first driver group including a first driver and a second driver, the first and second drivers being disposed in a first arrangement direction, wherein a carry signal output from the first driver is provided to the second driver through a carry signal line;
a second driver group including a third driver and a fourth driver, the third and fourth drivers being disposed in a direction opposite to the first arrangement direction; and
a third driver group including drivers disposed in the first arrangement direction,
the first driver group, the second driver group, and the third driver group are disposed in the first arrangement direction,
the second driver group is apart from the third driver group with a separation region corresponding to the notch therebetween,
the third driver is apart farthest away from the first driver group among the drivers of the second driver group, and
the third driver that receives a carry signal output from the second driver, through a carry signal line connecting the second driver to the third driver.

15. The display apparatus of claim 14, wherein
the first driver of the first driver group is electrically connected to a signal line disposed on an i-th row (i is a natural number) among the signal lines,
the second driver is electrically connected to a signal line disposed on an (i+j)-th row (j is a natural number) among the signal lines, the third driver of the second driver group is electrically connected to a signal line disposed on an (i+n)-th row (n is a natural number greater than j) among the signal lines, and the fourth driver of the second driver group is electrically connected to a signal line disposed on an (i+m)-th row (m is a natural number greater than n) among the signal lines.

16. The display apparatus of claim 15, wherein a driving signal output from the third driver is transferred to the signal line disposed on the (i+n)-th row through a first signal connection line passing across the separation region, and a driving signal output from the fourth driver is transferred to the signal line disposed on the (i+m)-th row through a second signal connection line passing across the separation region.

17. The display apparatus of claim 16, further comprising:

a common voltage supply line disposed in the peripheral area, wherein a portion of the first signal connection line and a portion of the second signal connection line each overlap a first portion of the common voltage supply line in the peripheral area.

18. The display apparatus of claim 16, further comprising:

a fourth driver group disposed adjacent to the first driver group in a direction facing the peripheral area in the display area, and including drivers that provide signals different from signals of the drivers of the first driver group;

a fifth driver group disposed adjacent to the second driver group in the direction facing the peripheral area in the display area, and including drivers that provide signals different from signals of the drivers of the second driver group; and a carry signal line connecting a driver adjacent to the fifth driver group among the drivers of the fourth driver group, to a driver disposed farthest away from the fourth driver group among the drivers of the fifth driver group.

19. The display apparatus of claim 18, wherein a portion of one of signal connection lines that transfer a driving signal output from each of the drivers of the fifth driver group is disposed between the first signal connection line and the second signal connection line.

20. The display apparatus of claim 19, wherein a portion of one of the signal connection lines is disposed on a layer different from a layer on which the first signal connection line and the second signal connection line are disposed.

* * * * *